(12) United States Patent
Tanaka et al.

(10) Patent No.: US 10,832,911 B2
(45) Date of Patent: Nov. 10, 2020

(54) SEMICONDUCTOR DEVICE

(71) Applicant: TOYODA GOSEI CO., LTD., Kiyosu (JP)

(72) Inventors: Nariaki Tanaka, Kiyosu (JP); Toru Oka, Kiyosu (JP); Yukihisa Ueno, Kiyosu (JP); Kota Yasunishi, Kiyosu (JP)

(73) Assignee: TOYODA GOSEI CO., LTD., Kiyosu (JP)

(*) Notice: Subject to any disclaimer, the term of this patent is extended or adjusted under 35 U.S.C. 154(b) by 0 days.

(21) Appl. No.: 16/555,960

(22) Filed: Aug. 29, 2019

(65) Prior Publication Data
US 2020/0098565 A1 Mar. 26, 2020

(30) Foreign Application Priority Data
Sep. 22, 2018 (JP) .................. 2018-178166

(51) Int. Cl.
H01L 21/04 (2006.01)
H01L 29/87 (2006.01)
H01L 21/02 (2006.01)
H01L 29/872 (2006.01)
H01L 29/47 (2006.01)
H01L 21/225 (2006.01)
H01L 29/20 (2006.01)

(52) U.S. Cl.
CPC ...... H01L 21/046 (2013.01); H01L 21/02576 (2013.01); H01L 21/02579 (2013.01); H01L 21/0495 (2013.01); H01L 21/2258 (2013.01); H01L 29/2003 (2013.01); H01L 29/47 (2013.01); H01L 29/872 (2013.01)

(58) Field of Classification Search
CPC ............. H01L 21/046; H01L 21/02576; H01L 21/02579; H01L 21/0495; H01L 21/2258; H01L 29/2003; H01L 29/47
USPC ........................................ 438/514
See application file for complete search history.

(56) References Cited

U.S. PATENT DOCUMENTS 3,646,406 A 2/1972 Logan et al.
8,835,930 B2 9/2014 Tsuchiya et al.
(Continued)

FOREIGN PATENT DOCUMENTS

JP S53-47678 B1 12/1978
JP 2013-033913 A 2/2013
(Continued)

Primary Examiner — Sheikh Maruf
(74) Attorney, Agent, or Firm — McGinn IP Law Group, PLLC

(57) ABSTRACT

An n-type GaN layer, a p-type diffusion region formed by ion implantation and annealing in a part of the n-type layer, and a Schottky electrode are formed on the n-type layer. A region without the p-type region is defined as region A, and a region with the p-type region is defined as region B. In region A, an average density of each electron trap level of the n-type layer in a region having a depth of 0.8 μm to 1.6 μm on the n-type layer side is set so as to satisfy the predetermined conditions. In region B, an average density of each carrier trap level of the n-type layer in a region having a depth of 0.8 μm to 1.6 μm on the n-type layer side from a boundary between the n-type layer and the p-type diffusion region is set so as to satisfy the predetermined conditions.

24 Claims, 20 Drawing Sheets

(56) References Cited

U.S. PATENT DOCUMENTS

| | | | | |
|---|---|---|---|---|
| 2008/0007988 A1* | 1/2008 | Ahn | ............... | G11C 13/0007 |
| | | | | 365/148 |
| 2009/0309124 A1* | 12/2009 | Wu | ............... | H01L 33/305 |
| | | | | 257/99 |
| 2010/0187595 A1* | 7/2010 | Lee | ............... | H01L 27/11521 |
| | | | | 257/321 |
| 2010/0230655 A1* | 9/2010 | Noshiro | ............... | H01L 45/04 |
| | | | | 257/5 |
| 2010/0240207 A1* | 9/2010 | Park | ............... | H01L 27/11521 |
| | | | | 438/591 |
| 2010/0265750 A1* | 10/2010 | Yan | ............... | G11C 13/0064 |
| | | | | 365/51 |
| 2010/0301351 A1* | 12/2010 | Flynn | ............... | H01L 21/02502 |
| | | | | 257/77 |
| 2012/0146048 A1* | 6/2012 | Kato | ............... | H01L 33/325 |
| | | | | 257/76 |
| 2013/0001585 A1* | 1/2013 | Tsuchiya | ............... | H01L 29/861 |
| | | | | 257/76 |
| 2013/0051116 A1* | 2/2013 | En | ............... | H01L 25/18 |
| | | | | 365/148 |
| 2013/0153850 A1* | 6/2013 | Yabuhara | ............... | H01L 45/1675 |
| | | | | 257/3 |
| 2013/0228735 A1* | 9/2013 | Higuchi | ............... | H01L 45/08 |
| | | | | 257/4 |
| 2013/0328009 A1* | 12/2013 | Miyagawa | ............... | H01L 45/148 |
| | | | | 257/4 |

FOREIGN PATENT DOCUMENTS

| | | |
|---|---|---|
| JP | 2013-131579 A | 7/2013 |
| JP | 2016-201433 A | 12/2016 |

\* cited by examiner

FIG. 14

No annealing

| Type | Ec-Et (eV) | Capturing cross-sectional area (cm2) | Trap density NTs (cm-3) | Density ratio to TE4 |
|---|---|---|---|---|
| TE1 | | | | |
| TE2 | 0.3 | 8.0E-15 | 1.0E+11 | 8.3E-02 |
| TE3 | | | | |
| TE4 | 0.59 | 2.0E-15 | 1.2E+12 | 1.0E+00 |
| TE5 | | | | |
| TE6 | | | | |
| TE7 | | | | |
| TE8 | | | | |
| TE9 | 0.8 | 4.0E-18 | 3.0E+12 | 2.5E+00 |

1050°C4min

| Type | Ec-Et (eV) | Capturing cross-sectional area (cm2) | Trap density NTs (cm-3) | Density ratio to TE4 |
|---|---|---|---|---|
| TE1 | 0.13 | 9.0E-18 | 3.6E+11 | 1.6E-01 |
| TE2 | 0.2 | 3.0E-17 | 9.7E+11 | 4.2E-01 |
| TE3 | 0.3 | 7.0E-18 | 5.0E+10 | 2.2E-02 |
| TE4 | 0.5 | 2.0E-15 | 2.3E+12 | 1.0E+00 |
| TE5 | | | | |
| TE6 | 0.77 | 2.0E-13 | 1.2E+13 | 5.2E+00 |
| TE7 | 0.93 | 3.0E-14 | 3.4E+12 | 1.5E+00 |
| TE8 | | | | |
| TE9 | 1.35 | 2.0E-12 | 5.2E+12 | 2.3E+00 |

1150°C4min

| Type | Ec-Et (eV) | Capturing cross-sectional area (cm2) | Trap density NTs (cm-3) | Density ratio to TE4 |
|---|---|---|---|---|
| TE1 | 0.16 | 7.0E-17 | 9.5E+12 | 9.9E-01 |
| TE2 | 0.21 | 7.0E-17 | 7.5E+12 | 7.8E-01 |
| TE3 | 0.39 | 3.0E-14 | 1.4E+12 | 1.5E-01 |
| TE4 | 0.5 | 2.0E-15 | 9.6E+12 | 1.0E+00 |
| TE5 | | | | |
| TE6 | 0.76 | 2.0E-13 | 4.8E+13 | 5.0E+00 |
| TE7 | 0.98 | 1.0E-13 | 1.4E+13 | 1.5E+00 |
| TE8 | | | | |
| TE9 | 1.23 | 1.0E-13 | 1.4E+13 | 1.5E+00 |

FIG. 18

No annealing

| Type | Ec-Et (eV) | Capturing cross-sectional area (cm2) | Trap density NTs (cm-3) | Density ratio to TE4 |
|---|---|---|---|---|
| TE1 | | | | |
| TE2 | | | | |
| TE3 | | | | |
| TE4 | 0.5 | 8.0E-17 | 2.2E+12 | 1.0E+00 |
| TE5 | | | | |
| TE6 | | | | |
| TE7 | | | | |
| TE8 | | | | |
| TE9 | | | | |
| TE10 | 2.32 | 4.0E-02 | 3.8E+12 | 1.7E+00 |
| TE11 | | | | |

| Type | Et-Ev (eV) | Capturing cross-sectional area (cm2) | Trap density NTs (cm-3) |
|---|---|---|---|
| TH1 | | | |
| TH2 | | | |
| TH3 | 0.81 | 2.0E-14 | 9.8E+12 |

1050°C 4min

| Type | Ec-Et (eV) | Capturing cross-sectional area (cm2) | Trap density NTs (cm-3) | Density ratio to TE4 |
|---|---|---|---|---|
| TE1 | 0.11 | 2.0E-18 | 4.4E+12 | 2.3E+00 |
| TE2 | 0.33 | 2.0E-12 | 3.3E+12 | 1.7E+00 |
| TE3 | | | | |
| TE4 | 0.55 | 5.0E-16 | 1.9E+12 | 1.0E+00 |
| TE5 | | | | |
| TE6 | | | | |
| TE7 | | | | |
| TE8 | | | | |
| TE9 | 0.86 | 3.0E-18 | 1.5E+12 | 7.9E-01 |
| TE10 | | | | |
| TE11 | | | | |

| Type | Et-Ev (eV) | Capturing cross-sectional area (cm2) | Trap density NTs (cm-3) |
|---|---|---|---|
| TH1 | | | |
| TH2 | | | |
| TH3 | 0.79 | 8.0E-15 | 4.1E+12 |

1150°C 4min

| Type | Ec-Et (eV) | Capturing cross-sectional area (cm2) | Trap density NTs (cm-3) | Density ratio to TE4 |
|---|---|---|---|---|
| TE1 | | | | |
| TE2 | | | | |
| TE3 | | | | |
| TE4 | 0.52 | 2.0E-16 | 3.1E+12 | 1.0E+00 |
| TE5 | | | | |
| TE6 | | | | |
| TE7 | | | | |
| TE8 | | | | |
| TE9 | | | | |
| TE10 | 1.66 | 6.0E-09 | 1.4E+13 | 4.4E+00 |
| TE11 | | | | |

| Type | Et-Ev (eV) | Capturing cross-sectional area (cm2) | Trap density NTs (cm-3) |
|---|---|---|---|
| TH1 | 0.14 | 9.0E-22 | 5.2E+12 |
| TH2 | | | |
| TH3 | 0.82 | 3.0E-14 | 6.7E+12 |

1250°C 30s

| Type | Ec-Et (eV) | Capturing cross-sectional area (cm2) | Trap density NTs (cm-3) | Density ratio to TE4 |
|---|---|---|---|---|
| TE1 | | | | |
| TE2 | 0.21 | 1.0E-16 | 8.0E+12 | 9.6E-01 |
| TE3 | | | | |
| TE4 | 0.57 | 1.0E-15 | 8.3E+12 | 1.0E+00 |
| TE5 | | | | |
| TE6 | | | | |
| TE7 | | | | |
| TE8 | | | | |
| TE9 | | | | |
| TE10 | | | | |
| TE11 | 1.88 | 4.0E-13 | 7.2E+13 | 8.7E+00 |

| Type | Et-Ev (eV) | Capturing cross-sectional area (cm2) | Trap density NTs (cm-3) |
|---|---|---|---|
| TH1 | | | |
| TH2 | | | |
| TH3 | 0.85 | 6.0E-15 | 1.6E+13 |

FIG. 21

1050°C 4min

| Type | Ec-Et (eV) | Capturing cross-sectional area (cm2) | Trap density NTs (cm-3) | Density ratio to TE4 |
|---|---|---|---|---|
| TE1 | 0.2 | 1.0E-14 | 3.7E+16 | 1.3E+01 |
| TE2 | 0.18 | 1.0E-17 | 5.8E+15 | 2.1E+00 |
| TE3 | | | | |
| TE4 | 0.46 | 7.0E-16 | 2.8E+15 | 1.0E+00 |
| TE5 | | | | |
| TE6 | 0.75 | 1.0E-14 | 3.3E+15 | 1.2E+00 |
| TE7 | 0.91 | 2.0E-15 | 5.4E+15 | 1.9E+00 |
| TE8 | | | | |
| TE9 | 1.27 | 2.0E-13 | 2.0E+16 | 7.1E+00 |
| TE10 | | | | |
| TE11 | | | | |

| Type | Et-Ev (eV) | Capturing cross-sectional area (cm2) | Trap density NTs (cm-3) |
|---|---|---|---|
| TH1 | | | |
| TH2 | | | |
| TH3 | | | |

1050°C 20min

| Type | Ec-Et (eV) | Capturing cross-sectional area (cm2) | Trap density NTs (cm-3) | Density ratio to TE4 |
|---|---|---|---|---|
| TE1 | 0.17 | 2.0E-16 | 2.2E+14 | 3.9E+01 |
| TE2 | 0.25 | 2.0E-15 | 2.2E+15 | 3.9E+02 |
| TE3 | | | | |
| TE4 | 0.48 | 7.0E-16 | 5.7E+12 | 1.0E+00 |
| TE5 | 0.61 | 3.0E-15 | 1.0E+13 | 1.8E+00 |
| TE6 | | | | |
| TE7 | 0.93 | 2.0E-14 | 3.3E+13 | 5.8E+00 |
| TE8 | | | | |
| TE9 | 1.17 | 2.0E-14 | 7.6E+14 | 1.3E+02 |
| TE10 | 1.37 | 2.0E-14 | 4.1E+13 | 7.2E+00 |
| TE11 | | | | |

| Type | Et-Ev (eV) | Capturing cross-sectional area (cm2) | Trap density NTs (cm-3) |
|---|---|---|---|
| TH1 | 0.22 | 2.0E-10 | 1.4E+14 |
| TH2 | | | |
| TH3 | | | |

1050°C 40min

| Type | Ec-Et (eV) | Capturing cross-sectional area (cm2) | Trap density NTs (cm-3) | Density ratio to TE4 |
|---|---|---|---|---|
| TE1 | 0.16 | 7.0E-17 | 1.8E+14 | |
| TE2 | 0.23 | 5.0E-16 | 7.9E+14 | |
| TE3 | | | | |
| TE4 | | | | |
| TE5 | 0.6 | 1.0E-15 | 2.8E+12 | |
| TE6 | | | | |
| TE7 | 0.92 | 1.0E-14 | 2.2E+13 | |
| TE8 | | | | |
| TE9 | 1.18 | 9.0E-15 | 1.3E+14 | |
| TE10 | 1.11 | 5.0E-17 | 2.6E+13 | |
| TE11 | | | | |

| Type | Et-Ev (eV) | Capturing cross-sectional area (cm2) | Trap density NTs (cm-3) |
|---|---|---|---|
| TH1 | 0.2 | 7.0E-12 | 1.9E+14 |
| TH2 | | | |
| TH3 | 0.88 | 9.0E-14 | 5.2E+12 |

SEMICONDUCTOR DEVICE

FIELD OF THE INVENTION

The present invention relates to a Group III nitride semiconductor device, and more specifically, to a semiconductor device having a p-type region formed by ion implantation and annealing.

BACKGROUND ART

A Group III nitride semiconductor such as GaN has a high dielectric breakdown field, and can achieve both high breakdown voltage and low on resistance. Therefore, it attracts attention as a material for power device, and a lot of research and development have been carried out.

Japanese Patent Application Laid-Open (kokai) No. 2013-33913 discloses a Group III nitride semiconductor pn diode. It also discloses that a low-loss element can be achieved by setting the average densities of the carrier trap levels of the n-type layer and the p-type layer to be equal to or less than a predetermined value. For why such an effect is obtained, the following reason is considered: non-radiative recombination is relatively suppressed by reducing the average densities of the carrier trap levels, thereby increasing radiative recombination. The light generated through radiative recombination is absorbed in the p-type layer, and the hole concentration is increased.

There is a problem that leakage current is increased when ion implantation and annealing are carried out to form a p-type layer. This problem seems to be related to the carrier trap level. However, in Japanese Patent Application Laid-Open (kokai) No. 2013-33913, it is not clear which carrier trap level contributes to the leakage current. Japanese Patent Application Laid-Open (kokai) No. 2013-33913 does not recite how the average densities of the carrier trap levels are controlled.

SUMMARY OF THE INVENTION

In view of the foregoing, an object of the present invention is to achieve a Group III nitride semiconductor device having suppressed leakage current and a production method therefor.

In a first aspect of the present invention, there is provided a semiconductor device having an n-type GaN layer with a donor concentration of $1 \times 10^{15}/cm^3$ to $2 \times 10^{16}/cm^3$, a p-type GaN region formed by ion implantation and annealing in a part of the n-type layer, and a Schottky electrode formed on the n-type layer and the p-type region and coming into Schottky contact with the n-type layer, wherein a region without the p-type region in plan view is defined as region A;

an electron trap energy level of 0.10 eV to 0.20 eV below the GaN conduction band edge is defined as TE1;

an electron trap energy level of 0.30 eV to 0.45 eV below the GaN conduction band edge is defined as TE3;

an electron trap energy level of 0.45 eV to 0.60 eV below the GaN conduction band edge is defined as TE4;

an average density of each electron trap level in the region A is an average density of each electron trap level of the n-type layer in a region having a depth of 0.8 µm to 1.6 µm on the n-type layer side from a boundary between the n-type layer and the Schottky electrode; and the average density of each electron trap level in the region A is set so that the ratio of the average density of the electron trap level TE1 to the average density of the electron trap level TE4 is larger than the ratio of the average density of the electron trap level TE3 to the average density of the electron trap level TE4, and the ratio of the average density of the electron trap level TE1 to the average density of the electron trap level TE4 is not larger than 1.

In a second aspect of the present invention, there is provided a semiconductor device having an n-type GaN layer with a donor concentration of $1 \times 10^{15}/cm^3$ to $2 \times 10^{16}/cm^3$, a p-type GaN region formed by ion implantation and annealing in a part of the n-type layer, and a Schottky electrode formed on the n-type layer and the p-type region and coming into Schottky contact with the n-type layer, wherein a region with the p-type region in plan view is defined as region B;

an electron trap energy level of 0.10 eV to 0.20 eV below the GaN conduction band edge is defined as TE1;

an electron trap energy level of 0.20 eV to 0.30 eV below the GaN conduction band edge is defined as TE2;

an electron trap energy level of 0.45 eV to 0.60 eV below the GaN conduction band edge is defined as TE4;

an electron trap energy level of 1.10 eV to 1.40 eV below the GaN conduction band edge is defined as TE9;

an average density of each electron trap level in the region B is an average density of each electron trap level of the n-type layer in a region having a depth of 0.8 µm to 1.6 µm on the n-type layer side from a boundary between the n-type layer and the p-type region; and the average density of each electron trap level in the region B is set so that the ratio of the average density of the electron trap level TE2 to the average density of the electron trap level TE4 is larger than the ratio of the average density of the electron trap level TE9 to the average density of the electron trap level TE4, and the ratio of the average density of the electron trap level TE9 to the average density of the electron trap level TE4 is larger than the ratio of the average density of the electron trap level TE1 to the average density of the electron trap level TE4.

In the first and second aspects of the present invention, the average density ratio is preferably set as follows to further suppress the leakage current.

The ratio of the average density of the electron trap level TE1 in the region A to the average density of the electron trap level TE1 in the region B is preferably set to not larger than 0.01.

The ratio of the average density of the electron trap level TE2 in the region A to the average density of the electron trap level TE2 in the region B is preferably set to not larger than 0.01.

The ratio of the average density of the electron trap level TE4 in the region A to the average density of the electron trap level TE4 in the region B is preferably set to 0.4 to 2.5.

An electron trap energy level of 0.90 eV to 1.00 eV below the GaN conduction band edge is defined as TE7, and the ratio of the average density of the electron trap level TE7 in the region A to the average density of the electron trap level TE7 in the region B is preferably set to not larger than 0.2.

The ratio of the average density of the electron trap level TE9 in the region A to the average density of the electron trap level TE9 in the region B is preferably set to not larger than 0.04.

In a third aspect of the present invention, there is provided a semiconductor device having an n-type GaN layer with a donor concentration of $1 \times 10^{15}/cm^3$ to $2 \times 10^{16}/cm^3$, a p-type GaN layer formed on the n-type layer, and a p-type GaN region formed by ion implantation and annealing in a part of the n-type layer, wherein a region without the p-type region in plan view is defined as region A;

an electron trap energy level of 0.45 eV to 0.60 eV below the GaN conduction band edge is defined as TE4;

an average density of each electron trap level in the region A is an average density of each electron trap level of the n-type layer in a region having a depth of 0.8 µm to 1.6 µm on the n-type layer side from a boundary between the n-type layer and the p-type layer; and the average density of the electron trap level TE4 of the n-type layer in the region A is set to not larger than 1/500 of the donor concentration of the n-type layer.

In a fourth aspect of the present invention, there is provided a semiconductor device having an n-type GaN layer with a donor concentration of $1 \times 10^{15}/cm^3$ to $2 \times 10^{16}/cm^3$, a p-type GaN layer formed on the n-type layer, and a p-type GaN region formed by ion implantation and annealing in a part of the n-type layer, wherein a region with the p-type region in plan view is defined as region B;

an electron trap energy level of 0.10 eV to 0.20 eV below the GaN conduction band edge is defined as TE1;

an electron trap energy level of 0.20 eV to 0.30 eV below the GaN conduction band edge is defined as TE2;

an electron trap energy level of 0.45 eV to 0.60 eV below the GaN conduction band edge is defined as TE4;

an electron trap energy level of 1.10 eV to 1.40 eV below the GaN conduction band edge is defined as TE9;

an average density of each electron trap level in the region B is an average density of each electron trap level of the n-type layer in a region having a depth of 0.8 µm to 1.6 µm on the n-type layer side from a boundary between the n-type layer and the p-type region; and an average density of each electron trap level of the n-type layer in the region B is set so that the ratio of the average density of the electron trap level TE2 to the average density of the electron trap level TE4 is larger than the ratio of the ratio of the average density of the electron trap level TE9 to the average density of the electron trap level TE4, and the ratio of the average density of the electron trap level TE9 to the average density of the electron trap level TE4 is larger than the ratio of the average density of the electron trap level TE1 to the average density of the electron trap level TE4.

In the third and fourth aspects of the present invention, the average density ratio is preferably set as follows to further suppress the leakage current.

The ratio of the average density of the electron trap level TE1 in the region A to the average density of the electron trap level TE1 in the region B is preferably set to not larger than 0.03.

The ratio of the average density of the electron trap level TE2 in the region A to the average density of the electron trap level TE2 in the region B is preferably set to not larger than 0.02.

The ratio of the average density of the electron trap level TE4 in the region A to the average density of the electron trap level TE4 in the region B is preferably set to 0.3 to 2.0.

A hole trap energy level of 0.80 eV to 0.90 eV above the GaN valence band edge is defined as TH3.

An average density of the hole trap level in the region A is an average density of the hole trap level of the p-type layer in a region having a depth of 0.02 µm to 0.05 µm on the p-type layer side from a boundary between the n-type layer and the p-type layer.

The average density of the hole trap level in the region B is an average density of the hole trap level of the p-type region in a region having a depth of 0.02 µm to 0.05 µm on the p-type region side from a boundary between the n-type layer and the p-type region.

The ratio of the average density of the hole trap level TH3 of the p-type layer in the region A to the average density of the hole trap level TH3 of the p-type region in the region B is preferably set to 0.7 to 1.4.

The present invention can achieve a Group III nitride semiconductor device having suppressed leakage current.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which:

FIG. 14 shows tables showing the characteristics for each electron trap level of the elements for evaluating region A of the semiconductor device according to the first embodiment;

FIG. 18 shows tables showing characteristics for each carrier trap level of the element for evaluating region A of the semiconductor device according to the second embodiment;

FIG. 21 shows tables showing energy, capturing cross-sectional area, and average carrier trap density for each carrier trap level type of the element for evaluating region B;

DETAILED DESCRIPTION OF PREFERRED EMBODIMENTS

Specific embodiments of the present invention will next be described with reference to the drawings. However, the present invention is not limited to the embodiments.

First Embodiment

Figure 1:
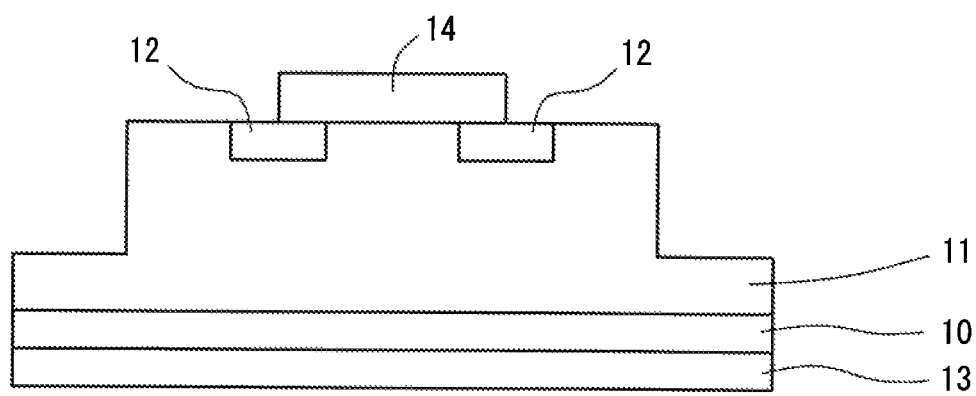
FIG. 1 shows the structure of a semiconductor device according to a first embodiment.

FIG. 1 shows the structure of a semiconductor device according to a first embodiment. As shown in FIG. 1, the semiconductor device of the first embodiment is a Schottky barrier diode comprising a substrate 10, an n-type layer 11, a p-type diffusion region 12, a cathode electrode 13, and an anode electrode 14.

The substrate 10 is made of n-GaN having a Si concentration of $1.0 \times 10^{18}/cm^3$. The substrate 10 has a thickness of 320 μm.

The n-type layer 11 is disposed on the substrate 10, and made of n-GaN having a donor concentration of $1 \times 10^{15}/cm^3$ to $2 \times 10^{16}/cm^3$ and a Si concentration of $1 \times 10^{15}/cm^3$ to $2.5 \times 10^{16}/cm^3$. The n-type layer 11 has a thickness of 5 μm to 20 μm.

The p-type diffusion region 12 is a region formed through Mg diffusion by ion implantation and annealing as described later, and made of p-GaN having a Mg concentration of $2 \times 10^{18}/cm^3$. The p-type diffusion region 12 is a ring in plan view, and the width thereof is 10 μm. The p-type diffusion region 12 is formed in a region extending from the surface of the n-type layer 11 to a depth of 1 μm. The p-type diffusion region 12 is formed to increase breakdown voltage of the semiconductor device of the first embodiment. To increase breakdown voltage, Mg concentration may be $0.5 \times 10^{17}/cm^3$ to $2 \times 10^{19}/cm^3$, the ring width of the p-type diffusion region 12 in plan view may be 1 μm to 20 μm, and the depth of the p-type diffusion region 12 may be 0.1 μm to 5 μm.

The cathode electrode 13 is formed in contact with the entire back surface of the substrate 10. The cathode electrode 13 is formed of Ti/Al and is in ohmic contact with the back surface of the substrate 10. Here, the symbol "/" refers to a layered structure. For example, "A/B" refers to a layered structure in which layer B is formed after formation of layer A. The same shall apply hereinafter.

The anode electrode 14 is formed on the n-type layer 11 and the p-type diffusion region 12. The anode electrode 14 is formed of Ni, and in Schottky contact with the n-type layer 11. The anode electrode 14 is a circle in plan view, and its outer periphery is in contact with the p-type diffusion region 12. Thus, the breakdown voltage of the semiconductor device of the first embodiment is increased by bringing the p-type diffusion region 12 in contact with the end of the anode electrode 14 where electric field is concentrated when a reverse bias is applied.

(Average Density of Carrier Trap Level)

Next will be described the average densities of the carrier trap levels (electron trap level and hole trap level) of the n-type layer 11 and the p-type diffusion region 12. The average density of each carrier trap level can be controlled by the annealing temperature and time for forming the p-type diffusion region 12 as described later.

Firstly, when Ec is a level of the GaN conduction band edge, Ev is a level of the valence band edge, and Et is an electron trap level, each electron trap level and hole trap level are referred to as follows.

TE1: electron trap level where Ec−Et=0.10 eV to 0.20 eV
TE2: electron trap level where Ec−Et=0.20 eV to 0.30 eV
TE3: electron trap level where Ec−Et=0.30 eV to 0.45 eV
TE4: electron trap level where Ec−Et=0.45 eV to 0.60 eV
TE5: electron trap level where Ec−Et=0.60 eV to 0.75 eV
TE6: electron trap level where Ec−Et=0.75 eV to 0.85 eV
TE7: electron trap level where Ec−Et=0.90 eV to 1.00 eV
TE8: electron trap level where Ec−Et=1.00 eV to 1.10 eV
TE9: electron trap level where Ec−Et=1.10 eV to 1.40 eV
TH3: hole trap level where Et−Ev=0.80 eV to 0.90 eV TE2, TE4, TE9, and TH3 of these carrier trap levels are levels generated without annealing, i.e., levels generated when the n-type layer 11 is crystal grown through MOCVD. Therefore, the average densities of these carrier trap levels are uniformly distributed in the depth direction of the n-type layer 11 at the crystal growth stage. On the other hand, other carrier trap levels (TE1, TE3, and TE5 to TE8) are levels generated by annealing. Therefore, the average densities of these carrier trap levels are higher on the surface side of the n-type layer 11 and lowered in the depth direction of the n-type layer 11.

In the semiconductor device of the first embodiment, the average densities of the carrier trap levels of the n-type layer 11 and the p-type diffusion region 12 are set as follows. The average densities of the electron trap levels are to be the average densities in a region having a depth of 0.8 μm to 1.6 μm on the n-type layer 11 side from a boundary between the n-type layer 11 and the anode electrode 14 or a boundary between the n-type layer 11 and the p-type diffusion region 12. The average density of the hole trap level is to be the average density in a region having a depth of 0.02 μm to 0.05 μm on the p-type diffusion region 12 side from a pn boundary (a boundary between the n-type layer 11 and the p-type diffusion region 12). Hereinafter, the same shall apply to the average densities of the carrier trap levels of the first embodiment.

When the main surface of the substrate 10 in the semiconductor device of the first embodiment is viewed from vertically above (i.e., in plan view), a region without the p-type diffusion region 12 is defined as region A and a region with the p-type diffusion region 12 is defined as region B.

For region A, the ratio (n1A/n4A) of the average density n1A of the electron trap level TE1 to the average density n4A of the electron trap level TE4 is set so as to be larger than the ratio (n3A/n4A) of the average density n3A of the electron trap level TE3 to the average density n4A of the electron trap level TE4, and not larger than 1. That is, it is set so as to satisfy (n3A/n4A)<(n1A/n4A)≤1.

For region B, the ratio (n2B/n4B) of the average density n2B of the electron trap level TE2 to the average density n4B of the electron trap level TE4 is set so as to be larger than the ratio (n9B/n4B) of the average density n9B of the electron trap level TE9 to the average density n4B of the electron trap level TE4, and the ratio (n9B/n4B) of the average density n9B of the electron trap level TE9 to the average density n4B of the electron trap level TE4 is set so as to be larger than the ratio (n1B/n4B) of the average density n1B of the electron trap level TE1 to the ratio of the average density n4B of the electron trap level TE4. That is, it is set so as to satisfy (n1B/n4B)<(n9B/n4B)<(n2B/n4B).

Leakage current can be suppressed in the semiconductor device of the first embodiment by setting the average densities of the electron trap levels as above in at least one of region A and region B. Needless to say, the average densities of the electron trap levels are set as above, more preferably, in both region A and region B.

To reduce leakage current, the average density of each electron trap level is preferably as low as possible. The average density of the electron trap level generated by annealing is preferably sufficiently reduced, for example, to be within the following range.

The average density of each electron trap level generated by annealing in region A is preferably within the following range. The average density n1A of the electron trap level TE1 is preferably not larger than $4 \times 10^{11}/cm^3$. The average density n3A of the electron trap level TE3 is preferably not larger than $6 \times 10^{10}/cm^3$. The average density n6A of the electron trap level TE6 is preferably not larger than $2 \times 10^{13}/cm^3$. The average density n7A of the electron trap level TE7 is preferably not larger than $4 \times 10^{12}/cm^3$.

The average density of each electron trap level not generated by annealing in region A is preferably within the following range. The average density n2A of the electron trap level TE2 is preferably not larger than 1/1000 of the donor concentration of the n-type layer 11. The average density n4A of the electron trap level TE4 is preferably not larger than 1/100 of the donor concentration of the n-type layer 11. The average density n9A of the electron trap level TE9 is preferably not larger than 1/500 of the donor concentration of the n-type layer 11.

The ratio of the average density of each electron trap level in region A is preferably within the following range. The ratios (n1A/n4A, n2A/n4A, and n3A/n4A) of the average densities n1A, n2A, and n3A of the electron trap levels TE1, TE2, and TE3 to the average density n4A of the electron trap level TE4 are preferably 0.01 to 0.5. The ratios (n6A/n4A, n7A/n4A) of the average densities n6A and n7A of the electron trap levels TE6 and TE7 to the average density n4A of the electron trap level TE4 are preferably 1.1 to 10.

Moreover, the average density of each electron trap level and hole trap level in region B is preferably within the following range. The average density n4B of the electron trap level TE4 is preferably not larger than 1/100 of the donor concentration of the n-type layer 11. The average density n1B of the electron trap level TE1 is preferably not larger than $3 \times 10^{14}/cm^3$. The average density n2B of the electron trap level TE2 is preferably not larger than $3 \times 10^{15}/cm^3$. The average density n5B of the electron trap level TE5 is preferably not larger than $1 \times 10^{13}/cm^3$. The average density n7B of the electron trap level TE7 is preferably not larger than $4 \times 10^{13}/cm^3$. The average density n9B of the electron trap level TE9 is not larger than $8 \times 10^{14}/cm^3$. The average density nH3B of the hole trap level TH3 is preferably not larger than $1 \times 10^{13}/cm^3$.

To reduce leakage current, the ratio of the average density of each carrier trap level in region A to the average density of each carrier trap level in region B is preferably within the following range. The ratio (n1A/n1B) of the average density n1A of the electron trap level TE1 in region A to the average density n1B of the electron trap level TE1 in region B is preferably not larger than 0.01. The ratio (n2A/n2B) of the average density n2A of the electron trap level TE2 in region A to the average density n2B of the electron trap level TE2 in region B is preferably not larger than 0.01. The ratio (n4A/n4B) of the average density n4A of the electron trap level TE4 in region A to the average density n4B of the electron trap level TE4 in region B is preferably 0.4 to 2.5. The ratio (n7A/n7B) of the average density n7A of the electron trap level TE7 in region A to the average density n7B of the electron trap level TE7 in region B is preferably not larger than 0.2. The ratio (n9A/n9B) of the average density n9A of the electron trap level TE9 in region A to the average density n9B of the electron trap level TE9 in region B is preferably not larger than 0.04.

Next will be described a method for producing the semiconductor device of the first embodiment with reference to FIGS. 2A to 2D.

Figure 2A:
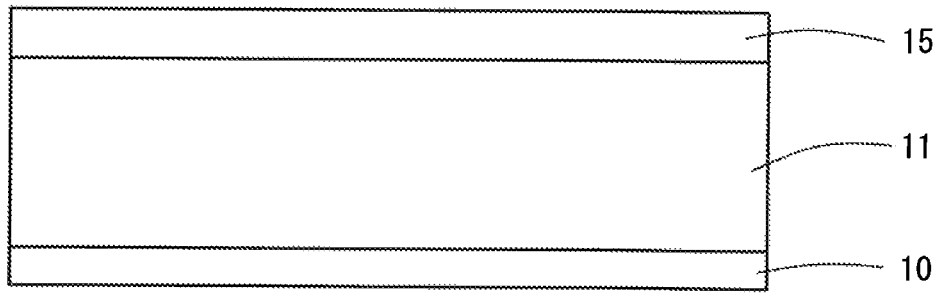
FIGS. 2A to 2D are sketches showing processes for producing the semiconductor device according to the first embodiment.

Firstly, an n-type n-GaN layer 11 and a p-type p-GaN layer 15 are sequentially deposited through MOCVD on an n-GaN substrate 10 (refer to FIG. 2A). The n-type layer 11 has a thickness of 5 μm to 20 μm and a donor concentration of $1 \times 10^{15}/cm^3$ to $2 \times 10^{16}/cm^3$. The p-type layer 15 has a thickness of 0.5 μm to 2 μm and a Mg concentration of $5 \times 10^{17}/cm^3$ to $2 \times 10^{19}/cm^3$.

Figure 2B:
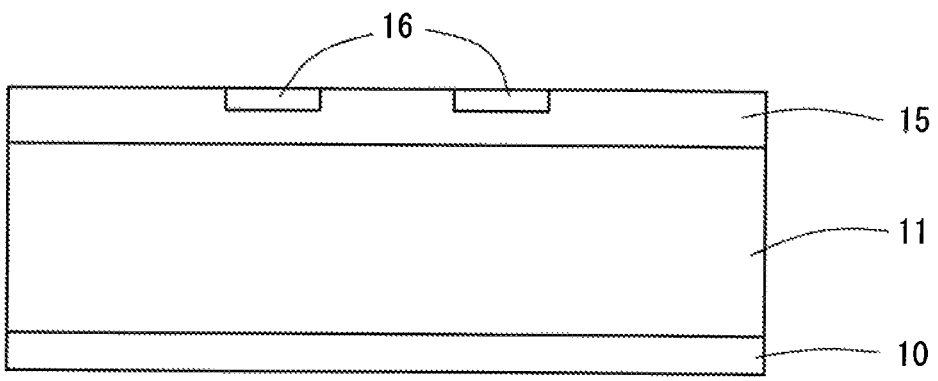
Figure 2C:
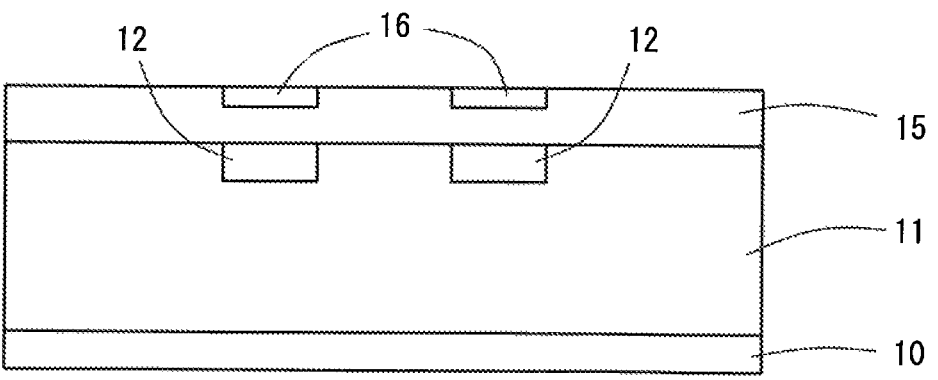
Figure 2D:
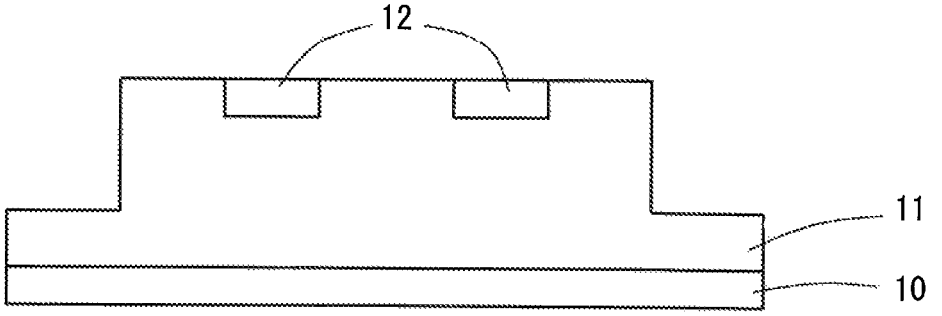

Subsequently, ion-implanted region 16 is formed in a predetermined region on the surface of the p-type layer 15 by Mg ion implantation (refer to FIG. 2B). Photoresist may be used as a mask for a region that is not ion-implanted. Any element may be ion-implanted, and the element may be a p-type dopant other than Mg or an n-type dopant such as Si.

Next, a SiN protective film is formed on the surfaces of the p-type layer 15 and the ion-implanted region 16, and annealing is performed. Annealing may be performed in an inactive gas atmosphere, for example, nitrogen atmosphere. Through annealing, Mg contained in the p-type layer 15 is diffused in the surface side of the n-type layer 11 below the ion-implanted region 16. Thereby, a p-type diffusion region 12 is formed in a region to a predetermined depth from the surface of the n-type layer 11. After that, the protective film is removed by hydrofluoric acid (refer to FIG. 2C). The average densities of the carrier trap levels of the n-type layer 11 and the p-type diffusion region 12 can be controlled by the annealing temperature and time for forming the p-type diffusion region 12. Specifically, the lower the annealing temperature, the lower the average density of each carrier trap level. The average density of each carrier trap level can be reduced by lengthening the annealing time. When the annealing temperature is too low, or the annealing time is too short, a p-type diffusion region 12 is hard to be formed in a predetermined region. Therefore, the annealing temperature is preferably adjusted from 1,000° C. to 1,100° C., and the annealing time is preferably adjusted in a range of 5 to 40 minutes. More preferably, the annealing temperature is 1,020° C. to 1,040° C., and the annealing time is 12 to 20 minutes.

The p-type layer 15 and the ion-implanted region 16 are removed by dry etching, to thereby expose the surface of the n-type layer 11 and the p-type diffusion region 12. In addition, the outer periphery of the n-type layer 11 is dry-etched up to a predetermined depth to form an element isolation region (refer to FIG. 2D).

Through vapor deposition, a cathode electrode 13 is formed on the back surface of the substrate 10, and an anode electrode 14 is formed on the n-type layer 11 and the p-type diffusion region 12. The anode electrode 14 is formed so as to have a pattern where its ends are on the p-type diffusion region 12. Thus, the semiconductor device of the first embodiment shown in FIG. 1 is produced.

Figure 3:
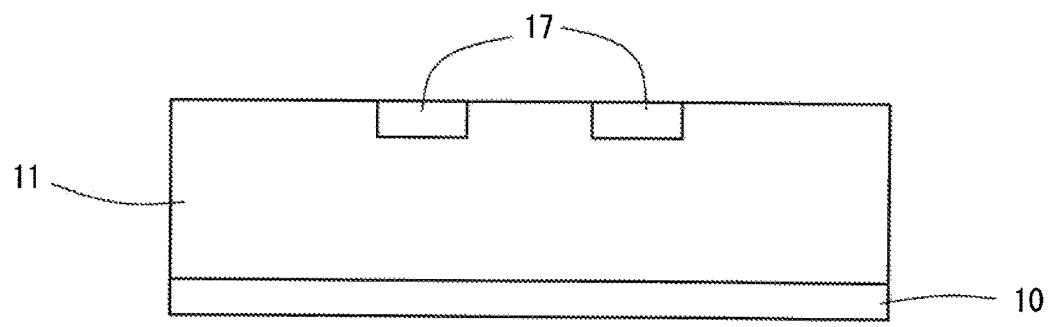
FIG. 3 shows a variation of the production method of the semiconductor device according to the first embodiment.

In the first embodiment, the p-type diffusion region 12 is formed by diffusing Mg in another region below the ion-implanted region. However, the ion-implanted region itself may be a p-type region 17 by implanting Mg ion directly into the n-type layer 11 and performing annealing without diffusing Mg (refer to FIG. 3). In this case, a p-type region can be formed without diffusing Mg by adjusting the temperature and the annealing time within a predetermined range. However, when a p-type diffusion region 12 is formed in the same way as in the first embodiment, the surface of the n-type layer 11 has less roughness, and the p-type diffusion region 12 can be accurately formed in a predetermined region.

In the semiconductor device of the first embodiment, the average density of each carrier trap level of the n-type layer 11 and the p-type diffusion region 12 is set as follows in region A and region B respectively when a region without the p-type diffusion region 12 is defined as region A, and a region with the p-type diffusion region 12 is defined as region B in plan view. Thereby, leakage current can be reduced.

For region A, the ratio (n1A/n4A) of the average density n1A of the electron trap level TE1 to the average density n4A of the electron trap level TE4 is set so as to be larger than the ratio of (n3A/n4A) of the average density n3A of the electron trap level TE3 to the average density n4A of the electron trap level TE4, and not larger than 1.

For region B, the ratio (n2B/n4B) of the average density n2B of the electron trap level TE2 to the average density n4B of the electron trap level TE4 is set so as to be larger than the ratio (n9B/n4B) of the average density n9B of the electron trap level TE9 to the average density n4B of the electron trap level TE4, and the ratio (n9B/n4B) of the average density n9B of the electron trap level TE9 to the average density n4B of the electron trap level TE4 is set so as to be larger than the ratio (n1B/n4B) of the average density n1B of the electron trap level TE1 to the average density n4B of the electron trap level TE4.

Second Embodiment

Figure 4:
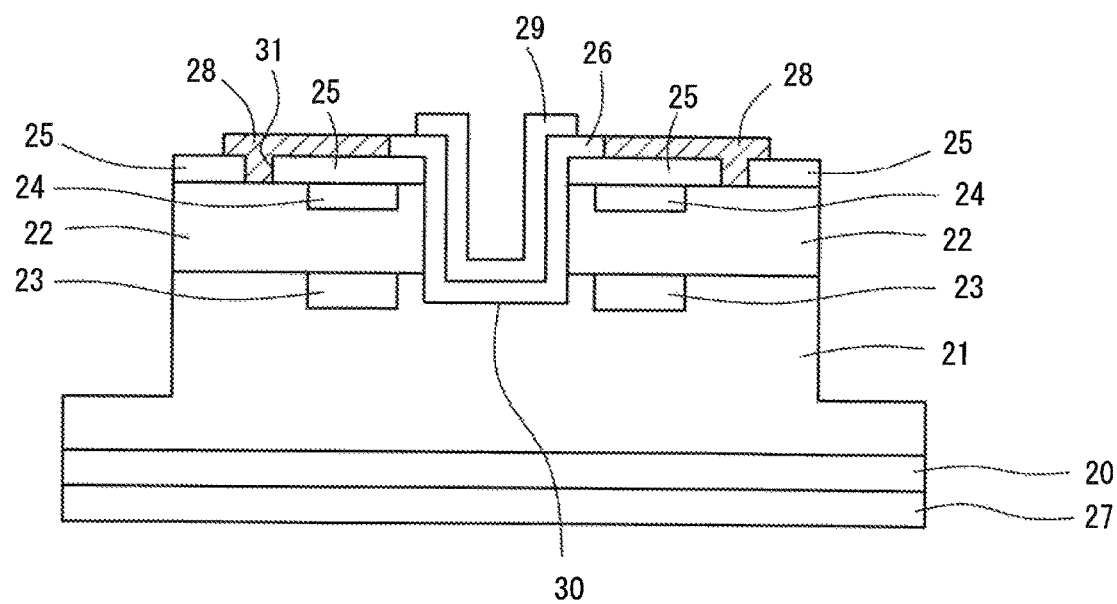
FIG. 4 shows the structure of a semiconductor device according to a second embodiment.

FIG. 4 shows the structure of a semiconductor device according to a second embodiment. As shown in FIG. 4, the semiconductor device of the second embodiment is a trench-type FET, and comprises a substrate 20, an n-type layer 21, a p-type layer 22, a p-type diffusion region 23, an ion-implanted region 24, an n-type regrowth layer 25, a gate insulating film 26, a drain electrode 27, a source electrode 28, and a gate electrode 29.

The substrate 20 is made of n-GaN having a Si concentration of $1.0 \times 10^{18}/cm^3$. The thickness of the substrate 10 is 320 μm.

The n-type layer 21 is disposed on the substrate 20, and is made of n-GaN having a donor concentration of $1 \times 10^{15}/cm^3$ to $2 \times 10^{16}/cm^3$ and a Si concentration of $1 \times 10^{15}/cm^3$ to $2.5 \times 10^{16}/cm^3$. The thickness of the n-type layer 11 is 10 μm.

The p-type layer 22 is made of p-GaN having a Mg concentration of $5 \times 10^{17}/cm^3$ to $2 \times 10^{19}/cm^3$. The thickness of the p-type layer 22 is 1 μm.

The n-type regrowth layer 25 is disposed on the p-type layer 22 and the ion-implanted region 24, and is made of n-GaN having a Si concentration of $1 \times 10^{18}/cm^3$ to $1 \times 10^{19}/cm^3$. The thickness of the n-type regrowth layer 25 is 0.2 μm.

In a predetermined region on the surface of the n-type regrowth layer 25, a trench 30 having a depth reaching the n-type layer 21 from the surface is formed. The n-type layer 21 is exposed on the bottom surface of the trench 30, and the n-type layer 21, the p-type layer 22, and the n-type regrowth layer 25 are exposed on the side surfaces of the trench 30.

The p-type diffusion region 23 is a region formed in the vicinity of the surface of the n-type layer 21 and in the vicinity of the trench 30. The p-type diffusion region 23 is a region formed through Mg diffusion by ion implantation and annealing as described below, which is made of p-GaN. Mg concentration of the p-type diffusion region 23 is $5 \times 10^{17}/cm^3$ to $2 \times 10^{19}/cm^3$. The p-type diffusion region 23 has an annular pattern surrounding the trench 30 in plan view, and its width is 2 μm. The p-type diffusion region 23 is formed in a region extending from the surface of the n-type layer 21 to a depth of 1 μm, and is formed deeper than the depth from the surface of the n-type layer 21 to the bottom surface of the trench 30. That is, the level of the bottom of the p-type diffusion region 23 is lower than the level of the bottom of the trench 30. By forming such p-type diffusion region 23 in the vicinity of the corners of the trench 30, an electric field concentrated on the corners of the trench 30 can be relaxed, thereby to increase breakdown voltage.

The ion-implanted region 24 is a region formed in the vicinity of the surface of the p-type layer 22 and in the vicinity of the trench 30, which is a p-type region. The ion-implanted region 24 is a region formed by implanting Mg ions for forming the p-type diffusion region 23 in the surface of the p-type layer 22 as described below, which is disposed above the p-type diffusion region 23. The ion-implanted region 24 has almost the same pattern as the p-type diffusion region 23 in plan view, which surrounds the trench 30. The ion-implanted region 24 may be a region formed by ion implanting a p-type dopant other than Mg.

The gate insulating film 26 is formed in a film along the bottom surface, the side surfaces, and the top surface of the trench 30 (a region in the vicinity of the trench 30 of the surface of the n-type regrowth layer 25). The gate insulating film 26 is made of $SiO_2$.

The drain electrode 27 is formed in contact with the entire back surface of the substrate 20. The drain electrode 27 is made of Ti/Al.

The source electrode 28 is formed on the n-type regrowth layer 25. A trench 31 is formed in a part of the n-type regrowth layer 25, which passes through the n-type regrowth layer 25 to thereby expose the p-type layer 22. The trench 31 is filled with the source electrode 28, and the source electrode 28 is connected to the p-type layer 22 via the trench 31. The source electrode 28 is made of Ti/Al.

The gate electrode 29 is formed in a film along the bottom surface, the side surfaces, and the top surface of the trench 30 (a region in the vicinity of the trench 30 of the surface of the n-type regrowth layer 25) via the gate insulating film 26. The gate electrode 29 is made of Al.

The semiconductor device of the second embodiment is a trench-type MISFET in which a region in the vicinity of the trench 30 of the p-type layer 22 serves as a channel.

(Average Density of Carrier Trap Level)

Next will be described the average densities of the carrier trap levels of the n-type layer 21, the p-type layer 22, and the p-type diffusion region 23. Carrier trap levels TE1 to TE9, and TH3 are defined same as in the first embodiment. That is, the average densities of the electron trap levels refer to the average densities in a region having a depth of 0.8 μm to 1.6 μm on the n-type layer 21 side from a pn boundary (a boundary between the n-type layer 21 and the p-type layer 22, or a boundary between the n-type layer 21 and the p-type diffusion region 23). The average density of the hole trap level refers to the average density in a region having a depth of 0.02 μm to 0.05 μm on the p side from a pn boundary (a boundary between the n-type layer 21 and the p-type layer 22 or a boundary between the n-type layer 21 and the p-type diffusion region 23).

In the semiconductor device of the second embodiment, the average densities of the carrier trap levels of the n-type layer 21, the p-type layer 22, and the p-type diffusion region 23 are set as follows. When the semiconductor device of the second embodiment is viewed from above (i.e., in plan view), a region without the p-type diffusion region 23 is defined as region A, and a region with the p-type diffusion region 23 is defined as region B. For region A, the average density n4A of the electron trap level TE4 is set so as to be not larger than $\frac{1}{500}$ of the donor concentration of the n-type layer 21.

For region B, the average densities of carrier trap levels are set in the same way as in the first embodiment. That is, the ratio (n2B/n4B) of the average density n2B of the electron trap level TE2 to the average density n4B of the electron trap level TE4 is set so as to be larger than the ratio (n9B/n4B) of the average density n9B of the electron trap level TE9 to the average density n4B of the electron trap level TE4, and the ratio (n9B/n4B) of the average density n9B of the electron trap level TE9 to the average density n4B of the electron trap level TE4 is set so as to be larger than the ratio (n1B/n4B) of the average density n1B of the electron trap level TE1 to the average density n4B of the electron trap level TE4. That is, it is set so as to satisfy (n1B/n4B)<(n9B/n4B)<(n2B/n4B).

By setting the average densities of the carrier trap levels as described above in at least one of region A and region B, leakage current can be suppressed in the semiconductor device of the second embodiment. Needless to say, the average densities of the electron trap levels are set in preferably both region A and region B as described above.

In the second embodiment as well as in the first embodiment, the average density of each carrier trap level is preferably as low as possible to reduce leakage current. For example, the average density of each carrier trap level is preferably within the following range.

The average density of each carrier trap level in region A is preferably within the following range. The average density n1A of the electron trap level TE1 is preferably not larger than $5 \times 10^{12}/cm^3$. The average density n2A of the electron trap level TE2 is preferably not larger than $8 \times 10^{12}/cm^3$. The average density n4A of the electron trap level TE4 is preferably not larger than $4 \times 10^{12}/cm^3$. The average density n9A of the electron trap level TE9 is preferably not larger than $2 \times 10^{12}/cm^3$. The average density nH3A of the hole trap level TH3 is preferably not larger than $7 \times 10^{12}/cm^3$.

In region A, the ratios of the average densities of the electron trap levels are preferably within the following range. The ratios (n1A/n4A and n2A/n4A) of the average densities n1A and n2A of the electron trap levels TE1 and TE2 to the average density n4A of the electron trap level TE4 are preferably not larger than 2.5.

The average density of each carrier trap level in region B is preferably within the following range. The average density n4B of the electron trap level TE4 is preferably not larger than $\frac{1}{100}$ the donor concentration of the n-type layer 11. The average density n1B of the electron trap level TE1 is preferably not larger than $3 \times 10^{14}/cm^3$. The average density n2B of the electron trap level TE2 is preferably not larger than $3 \times 10^{15}/cm^3$. The average density n5B of the electron trap level TE5 is preferably not larger than $1 \times 10^{13}/cm^3$. The average density n7B of the electron trap level TE7 is preferably not larger than $4 \times 10^{13}/cm^3$. The average density n9B of the electron trap level TE9 is preferably not larger than $8 \times 10^{14}/cm^3$. The average density nH3B of the hole trap level TH3 is preferably not larger than $1 \times 10^{13}/cm^3$.

To reduce leakage current, the ratio of the average density of each carrier trap level in region A to the average density of each carrier trap level in region B is preferably within the following range. The ratio (n1A/n1B) of the average density n1A of the electron trap level TE1 in region A to the average density n1B of the electron trap level TE1 in region B is preferably not larger than 0.03. The ratio (n2A/n2B) of the average density n2A of electron trap level TE2 in region A to the average density n2B of the electron trap level TE2 in region B is preferably not larger than 0.02. The ratio (n4A/n4B) of the average density n4A of the electron trap level TE4 in region A to the average density n4B of the electron trap level TE4 in region B is preferably 0.3 to 2.0. The ratio (n9A/n9B) of the average density n9A of the electron trap level TE9 in region A to the average density n9B of the electron trap level TE9 in region B is preferably not larger than 0.02. The ratio (nH3A/nH3B) of the average density nH3A of the hole trap level TH3 in region A to the average density nH3B of the hole trap level TH3 in region B is preferably 0.7 to 1.4.

Next will be described a method for producing the semiconductor device of the second embodiment with reference to FIGS. 5A to 5E.

Figure 5A:
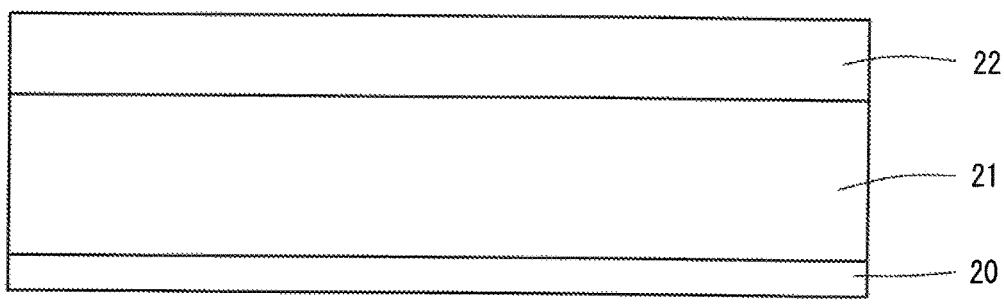
FIGS. 5A to 5E are sketches showing processes for producing the semiconductor device according to the second embodiment.

Firstly, an n-type layer 21 made of n-GaN and a p-type layer 22 made of p-GaN are sequentially deposited through MOCVD on an n-GaN substrate 20 (refer to FIG. 5A). Subsequently, annealing is performed to activate Mg contained in the p-type layer 22 and attain p-type conduction.

Figure 5B:
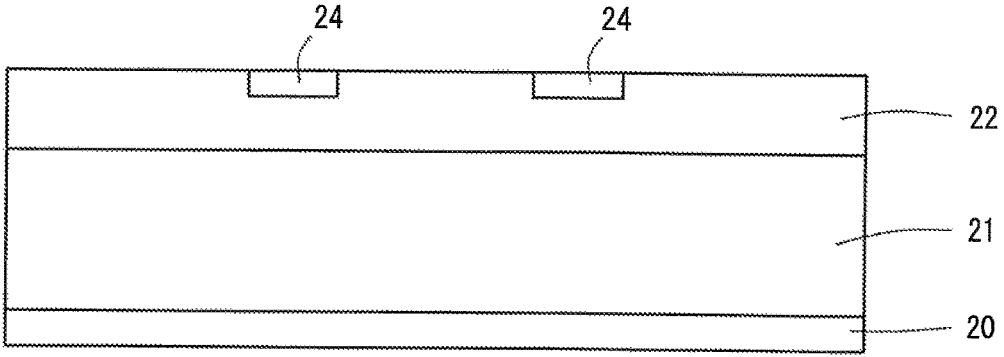
Figure 5C:
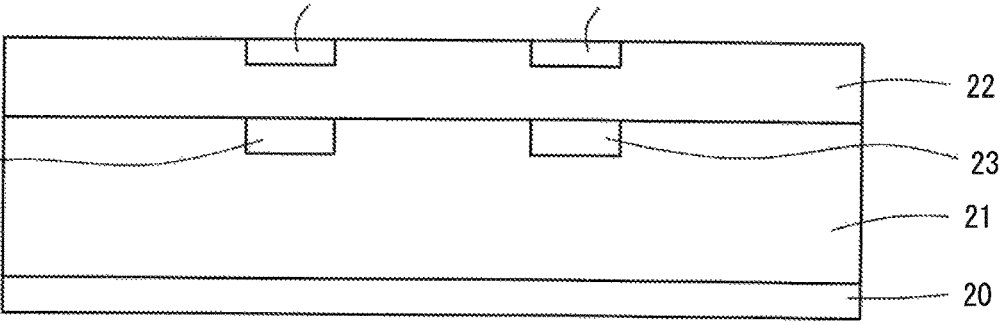

Next, an ion-implanted region 24 is formed by ion implantation of Mg in a predetermined region on the surface of the p-type layer 22 (refer to FIG. 5B). Photoresist may be used as a mask for a region that is not ion-implanted.

Next, a SiN protective film is formed on the surfaces of the p-type layer 22 and the ion-implanted region 24, and annealing is performed. Annealing may be performed in an inactive gas atmosphere, for example, nitrogen atmosphere. Mg contained in the p-type layer 22 is diffused by annealing in a region below the ion-implanted region 24 on the surface side of the n-type layer 21. Thereby, a p-type diffusion region 23 is formed in a region below the ion-implanted region 24 and extending from the surface of the n-type layer 21 to a predetermined depth. After that, the protective film is removed by hydrofluoric acid (refer to FIG. 5C). The average densities of the carrier trap levels of the n-type layer 21 and the p-type diffusion region 23 can be controlled by the annealing temperature and time for forming the p-type diffusion region 23. Specifically, the lower the annealing temperature, the lower the average density of the carrier trap level. Moreover, the average density of the carrier trap level can be reduced by lengthening the annealing time. When the annealing temperature is too low, or the annealing time is too short, a p-type diffusion region 23 is hard to be formed in a predetermined region. Therefore, the annealing temperature is preferably adjusted from 1,000° C. to 1,100° C., and the annealing time is preferably adjusted from 5 to 40 minutes. More preferably, the annealing temperature is 1,020° C. to 1,040° C., and the annealing time is 12 to 20 minutes.

Figure 5D:
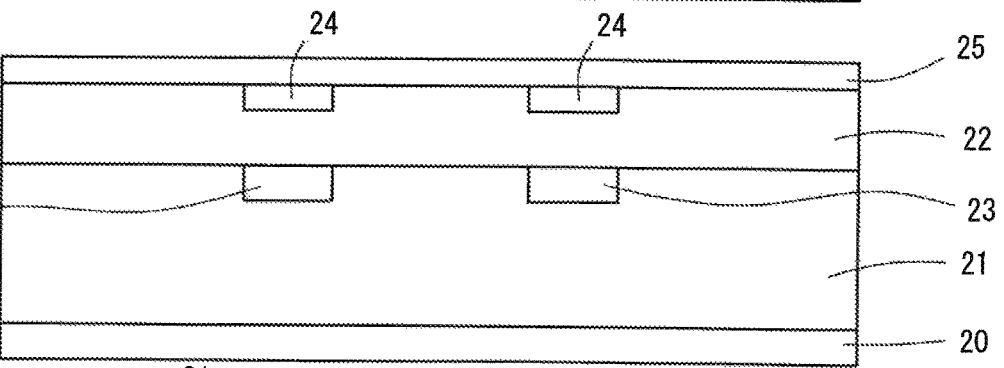
Figure 5E:
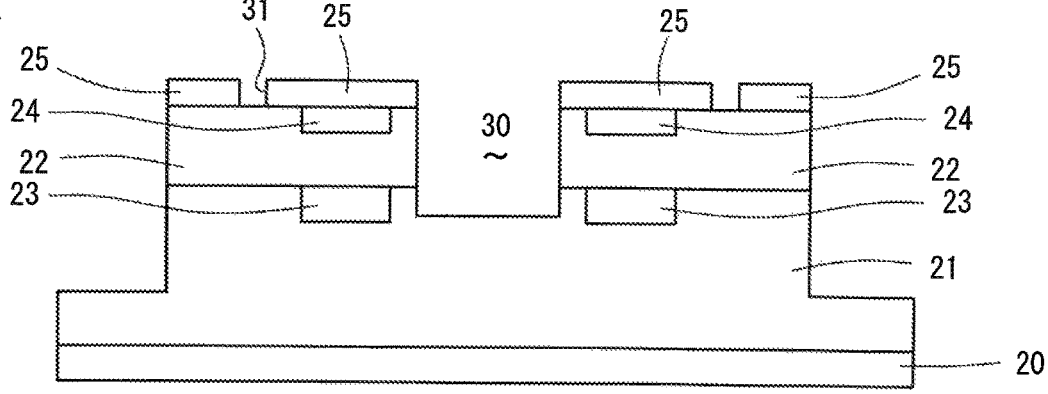

An n-type regrowth layer 25 made of n-GaN is formed through MOCVD on the p-type layer 22 (refer to FIG. 5D).

A part of the n-type regrowth layer 25 is dry etched until the n-type layer 21 is exposed, to thereby form a trench 30. A part of the n-type regrowth layer 25 is dry etched until the p-type layer 22 is exposed, to thereby form a trench 31 for bringing the source electrode 28 into contact with the p-type layer 22. In addition, the outer periphery of the n-type regrowth layer 25, the p-type layer 22 and a part of the n-type layer 21 is dry-etched up to a predetermined depth, to thereby form an element isolation region (refer to FIG. 5E).

Through ALD, a gate insulating film 26 is formed on the bottom surface, side surfaces and top surface of the trench 30. Through vapor deposition, a source electrode 28 is formed on the n-type regrowth layer 25, and is brought into contact with the p-type layer 22 via the trench 31. Through vapor deposition, a gate electrode 29 is formed on the bottom surface, side surfaces, and top surface of the trench 30 via the gate insulating film 26. Through vapor deposition, a drain electrode 27 is formed on the back surface of the substrate 20. Thus, the semiconductor device of the first embodiment shown in FIG. 4 is produced.

Variation 1 of Second Embodiment

Figure 6:
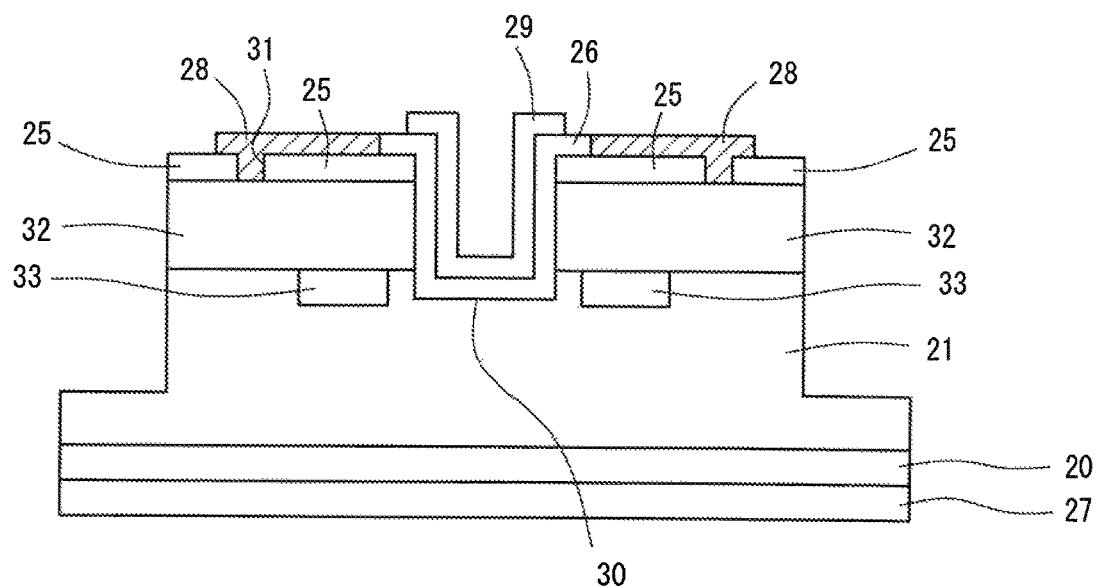
FIG. 6 shows the structure of a first variation of the semiconductor device according to the second embodiment.

In the second embodiment, the p-type diffusion region 23 is formed by diffusing Mg in a region different from the ion-implanted region 24. However, the ion-implanted region itself may be a p-type region 33 by performing ion implantation and annealing directly on the n-type layer 21, and activating Mg without being diffused. In this case, in the semiconductor device of the second embodiment, the ion-implanted region 24 does not exist, and a regrown p-type layer 32 exists instead of the p-type layer 22 (refer to FIG. 6). The production method for this case will be described below.

Figure 7A:
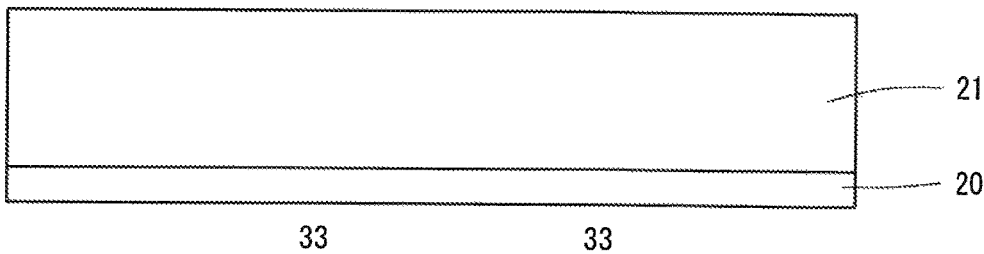
FIGS. 7A to 7C are sketches showing processes for producing the first variation of the semiconductor device according to the second embodiment.

Firstly, an n-type layer 21 made of n-GaN is deposited through MOCVD on an n-GaN substrate 20 (refer to FIG. 7A).

Figure 7B:
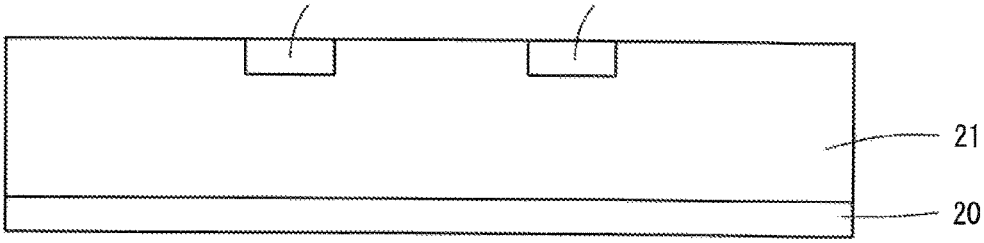

Subsequently, an ion-implanted region is formed in a predetermined region on the surface of the n-type layer 21 by ion implantation of Mg. A SiN protective film is formed on the surfaces of the n-type layer 21 and the ion-implanted region, and annealing is performed. Annealing may be performed in an inactive gas atmosphere, for example, nitrogen atmosphere. By annealing, Mg contained in the ion-implanted region is activated without being diffused. Thus, the ion-implanted region is made as the p-type region 33 (refer to FIG. 7B).

Figure 7C:
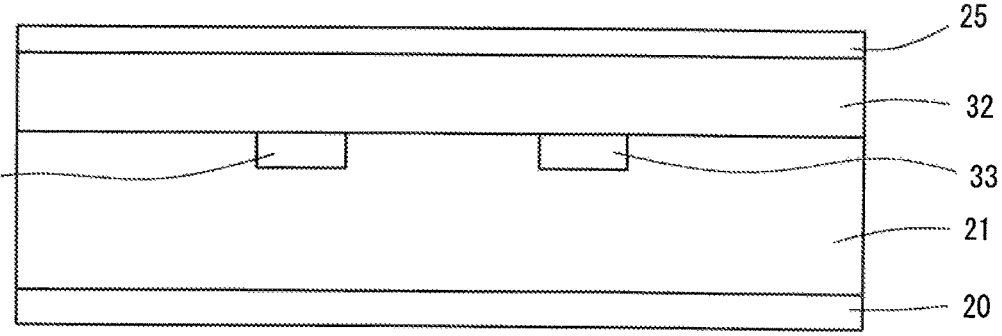

Next, a p-type regrowth layer 32 made of p-GaN and an n-type regrowth layer 25 made of n-GaN are formed through MOCVD on the n-type layer 21 and the p-type region 33 (refer to FIG. 7C). After this, the semiconductor device shown in FIG. 6 can be produced in the similar processes as in the second embodiment.

Variation 2 of Second Embodiment

Figure 8:
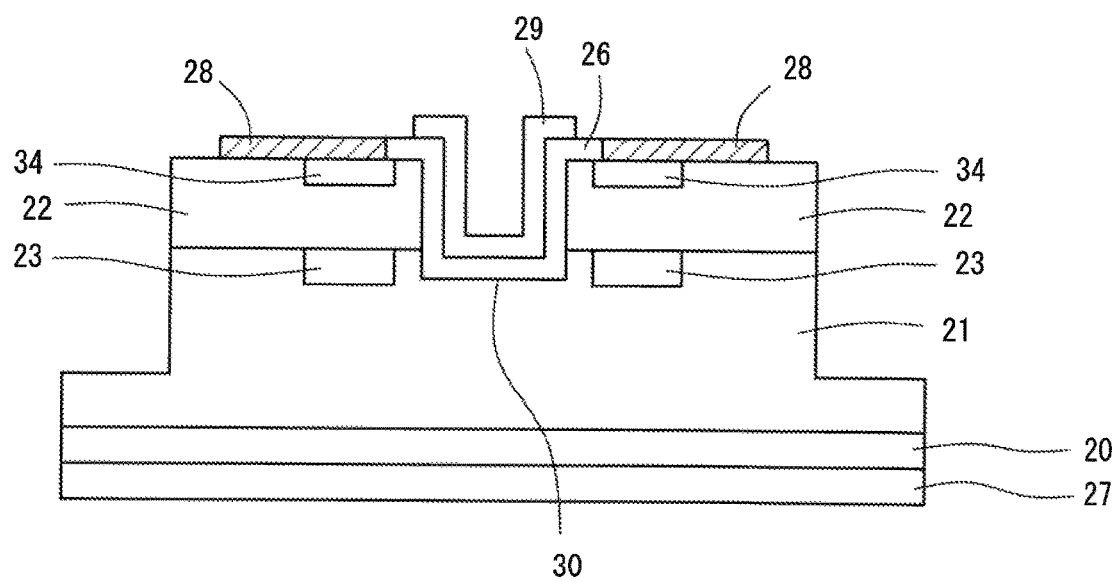
FIG. 8 shows the structure of a second variation of the semiconductor device according to the second embodiment.

In the second embodiment, an ion-implanted region 24 is formed by ion implantation of Mg. However, an ion-implanted region 34 may be formed by ion implantation of n-type dopant such as Si. A p-type diffusion region 23 can be formed in a similar region as when Mg is ion implanted. Since the ion-implanted region 34 is n-type, the n-type regrowth layer 25 may be omitted in the second embodiment (refer to FIG. 8).

Experimental Example

Next will be described experimental examples of the first and second embodiments.

An element for evaluating region A of the semiconductor device of the first embodiment (refer to FIG. 9), an element for evaluating region A of the semiconductor device of the second embodiment (refer to FIG. 10), and an element for evaluating region B of the semiconductor devices of the first and second embodiments (refer to FIG. 11) were produced in this way. Carrier trap level types and average densities of carrier trap levels were evaluated.

(Evaluation of Region A of Semiconductor Device of the First Embodiment)

Figure 9:
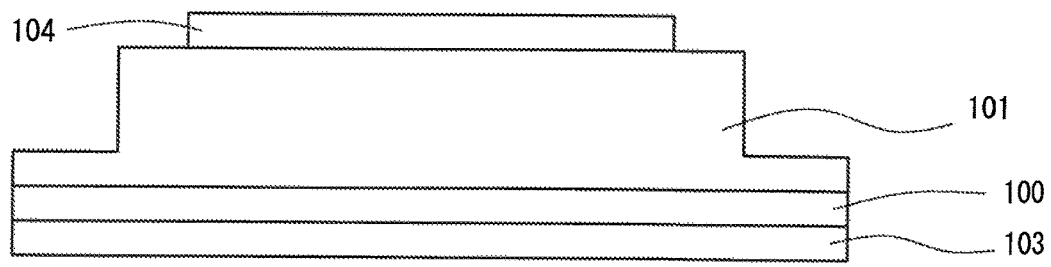
FIG. 9 shows the structure of an element for evaluating region A of the semiconductor device according to the first embodiment.

An element for evaluating region A of the first embodiment was produced as follows. Firstly, an n-type layer 101 having a thickness of 10 μm and a donor concentration of $2.5 \times 10^{15}/cm^3$ was formed through MOCVD on a substrate 100 made of n-GaN having a Si concentration of $1.0 \times 10^{18}/cm^3$ as shown in FIG. 9. Subsequently, a SiN protective film was formed on the n-type layer 101, and an annealed element and an unannealed element were formed. Two elements were produced by annealing at 1,050° C. for 4 minutes and 1,150° C. for 4 minutes. After that, the protective film is removed by hydrofluoric acid, the outer periphery of the n-type layer 101 is dry-etched to thereby form an element isolation region, an anode electrode 104 made of Ni was formed in Schottky contact on the surface of the n-type layer 101, a cathode electrode 103 made of Al/Ti was formed on the back surface of the substrate 100.

Figure 12:
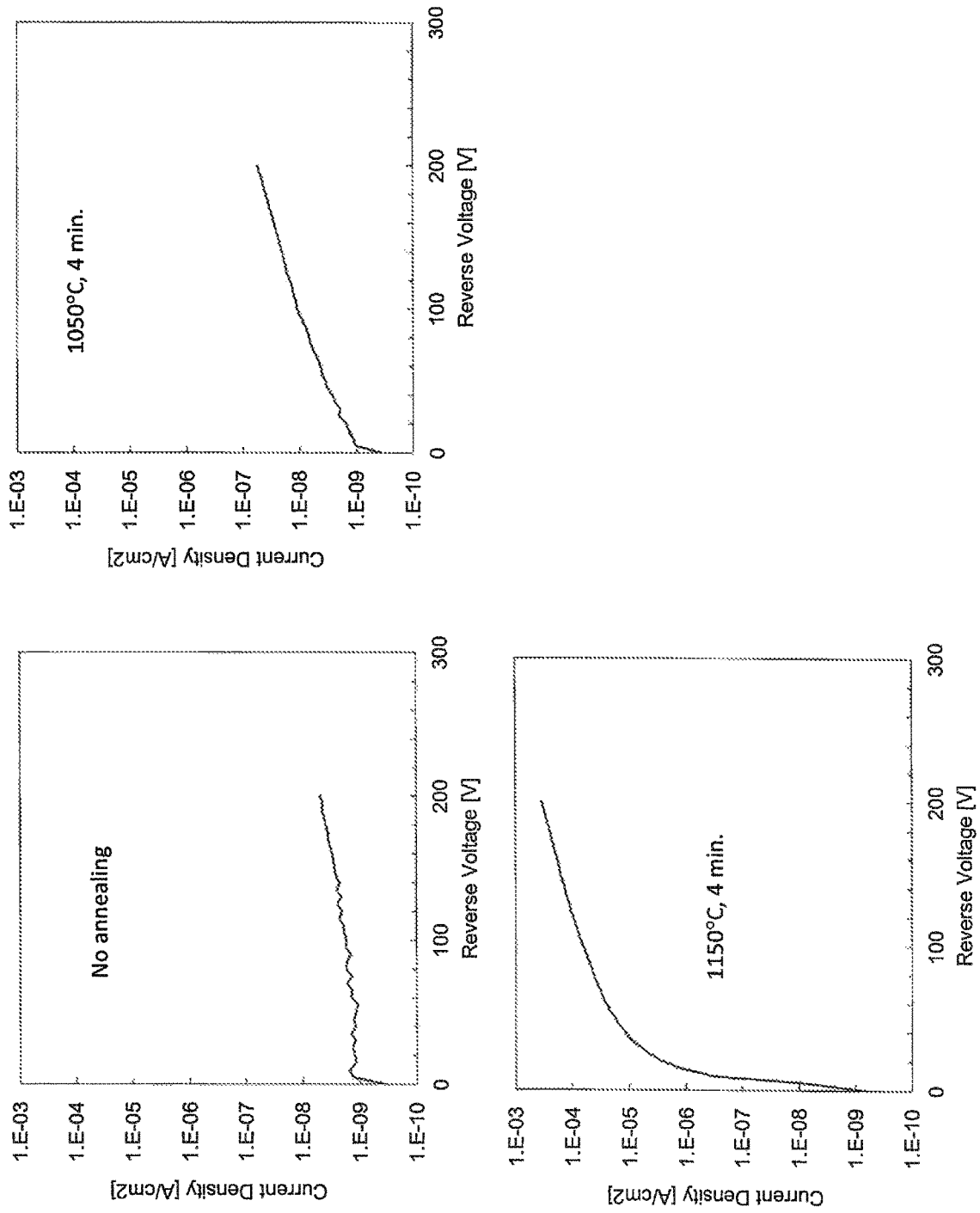
FIG. 12 shows graphs showing I-V characteristics of the elements for evaluating region A of the semiconductor device according to the first embodiment.
Figure 13:
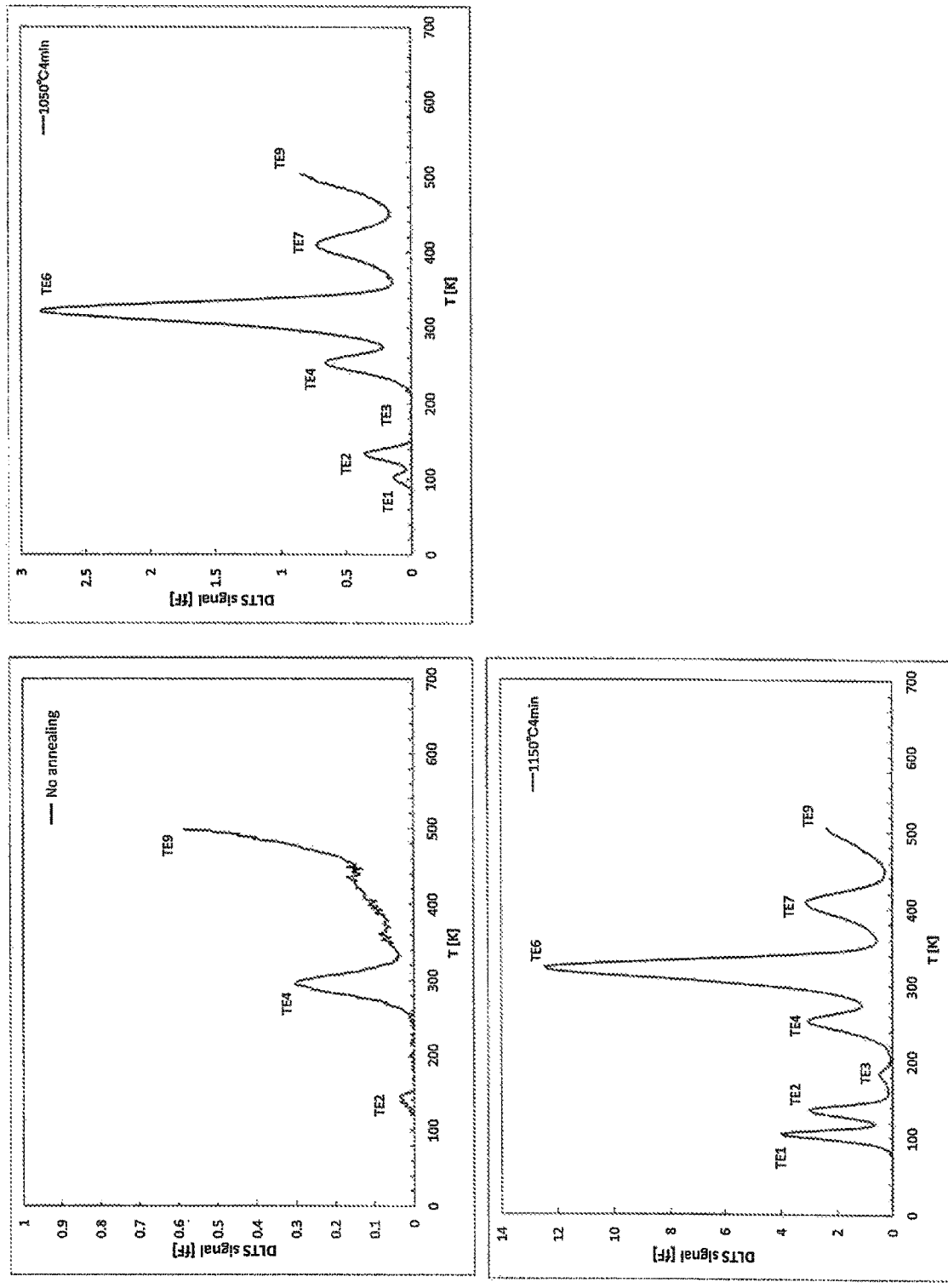
FIG. 13 shows graphs showing DLTS measurement results of the elements for evaluating region A of the semiconductor device according to the first embodiment.

I-V measurements were performed by applying a reverse voltage of 0 V to 200 V at a temperature of 25° C. to the thus-produced element for evaluating region A. FIG. 12 shows graphs showing the measurement results. In FIG. 12, for example, 1·E-09 means $1 \times 10^{-9}$ (the same applies hereinafter). Moreover, DLTS (Deep Level Transient Spectroscopy) measurement was performed at a temperature of 77 K to 500 K, a bias voltage of −5V, and a pulse voltage of 0V. FIG. 13 shows graphs showing the measurement results.

As shown in FIG. 12, leakage current is generated due to annealing, and the higher the annealing temperature is, the more the leakage current is generated. The annealing temperature may be not higher than 1,050° C. to reduce leakage current.

Electron trap levels TE1 to TE9 were specified by DLTS measurement in a region having a depth of 0.8 μm to 1.6 μm on the n-type layer 101 side from a boundary between the n-type layer 101 and the anode electrode 104. FIG. 14 shows tables showing energy level, capturing cross-sectional area, average electron trap density, and ratio to average density of electron trap level TE4 for each electron trap level type. As shown in FIG. 14, it was found that TE2, TE4, and TE9 of electron trap levels are carrier trap levels generated without annealing as grown. It was also found that the average densities of these electron trap levels are increased by annealing. Therefore, the increase of leakage current generated by annealing is caused by the increase of the average densities of these electron trap levels. The average densities of TE5 and TE8 could not be detected because these were lower than a detection limit.

Leakage current is largely increased at the annealing temperature of 1,150° C. compared to the annealing temperature of 1,050° C. It means that the relation among the average densities of a plurality of electron trap levels at 1,050° C. contribute more largely to the reduction of the leakage current than the relation at 1,150° C. The lower the trap level, the larger the contribution to leakage current. The p-type diffusion region 12 cannot be formed without annealing. Therefore, the relation capable of reducing leakage current is preferably specified by the average densities of the lower electron trap levels TE1 and TE3 generated by annealing. The average densities of the electron trap level generated without annealing is preferably used as criteria for evaluating the average densities of the electron trap levels TE1 and TE3.

Figure 15:
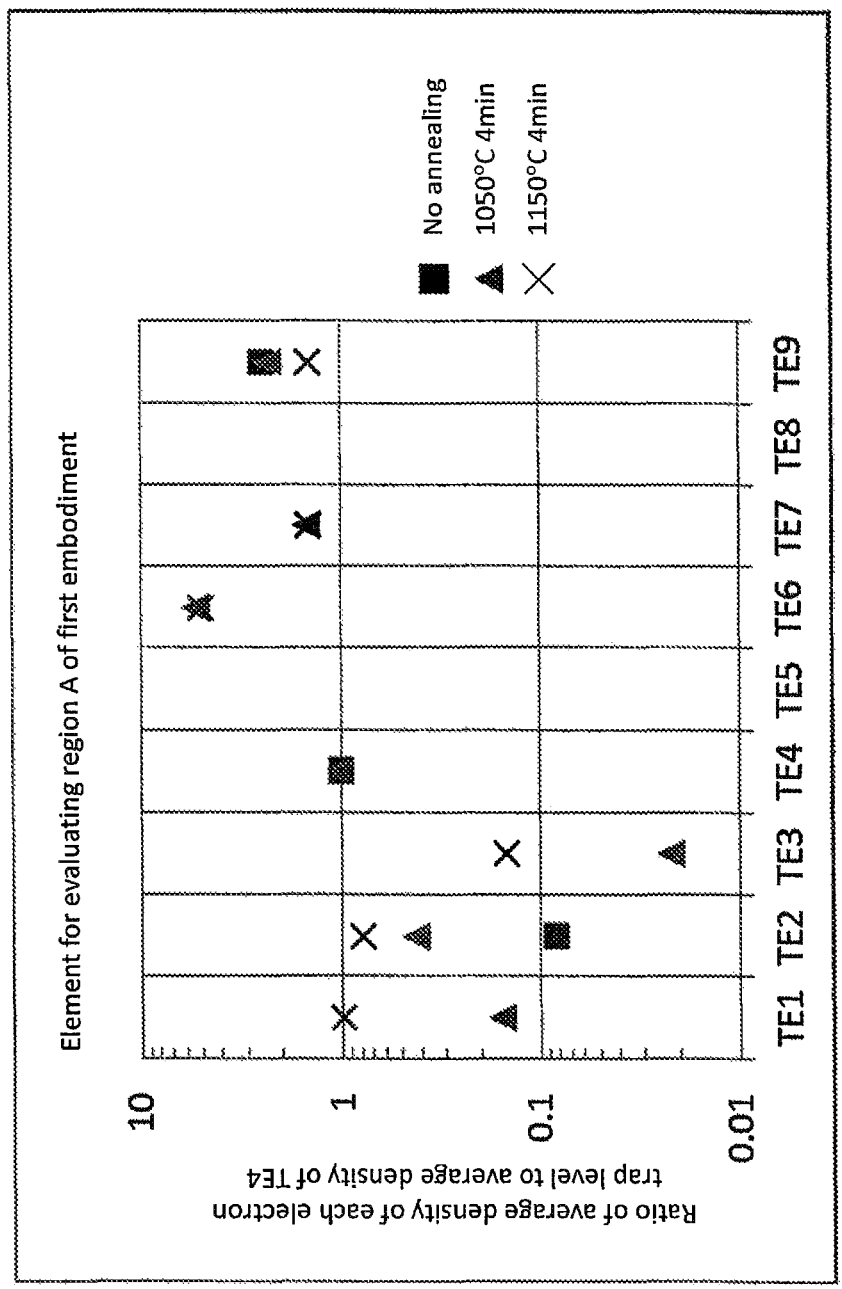
FIG. 15 is a graph showing the ratios of the average density of each electron trap level to the average density of the electron trap level TE4.

FIG. 15 is a graph showing the ratios of the average density of each electron trap level to the average density of the electron trap level TE4. As is clear from FIGS. 15, TE1 and TE3 are largely varied to TE4 of the electron trap levels generated by annealing. The average density of the electron trap level TE1 is larger than the average density of the electron trap level TE3 at both annealing temperatures of 1,050° C. and 1,150° C. The ratio of the average density of the electron trap level TE1 to the average density of the electron trap level TE4 is larger than 1 at the annealing temperature of 1,150° C., and not larger than 1 at the annealing temperature of 1,050° C.

For the above reason, in region A of the semiconductor device of the first embodiment, the ratio of the average density of the electron trap level TE1 to the average density of the electron trap level TE4 is set so as to be larger than the ratio of the average density of the electron trap level TE3 to the average density of the electron trap level TE4, and the ratio of the average density of the electron trap level TE1 to the average density of the electron trap level TE4 is set so as to be not larger than 1. Thereby, the relation of the average densities of the electron trap levels capable of reducing leakage current (the relation of the average densities of the electron trap levels at the annealing temperature of 1,050° C.) was specified.

(Evaluation of Region A of Semiconductor Device of Second Embodiment)

Figure 10:
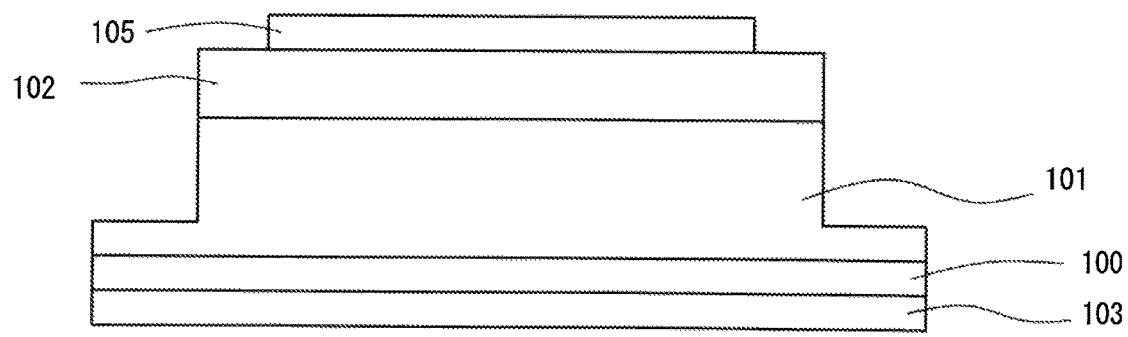
FIG. 10 shows the structure of an element for evaluating region A of the semiconductor device according to the second embodiment.

An element for evaluating region A of the second embodiment was produced as follows. Firstly, an n-type layer 101 having a thickness of 10 μm and a donor concentration of $5 \times 10^{15}/cm^3$ and a p-type layer 102 made of p-GaN having a thickness of 1 μm and a Mg concentration of $2 \times 10^{18}/cm^3$ were sequentially deposited through MOCVD on a substrate 100 made of n-GaN having a Si concentration of $1.0 \times 10^{18}/cm^3$ as shown in FIG. 10. Subsequently, a SiN protective film was formed on the p-type layer 102. An element subjected to annealing and an element not subjected to annealing were produced. The elements were produced by annealing at 1,050° C. for 4 minutes, 1,150° C. for 4 minutes, and 1,250° C. for 30 seconds. After that, the protective film was removed by hydrofluoric acid, and the outer periphery of the element was dry-etched to thereby form an element isolation region. Subsequently, an anode electrode 105 made of Pd for ohmic contact on the surface of the p-type layer 102, and a cathode electrode 103 made of Al/Ti was formed on the back surface of the substrate 100.

Figure 16:
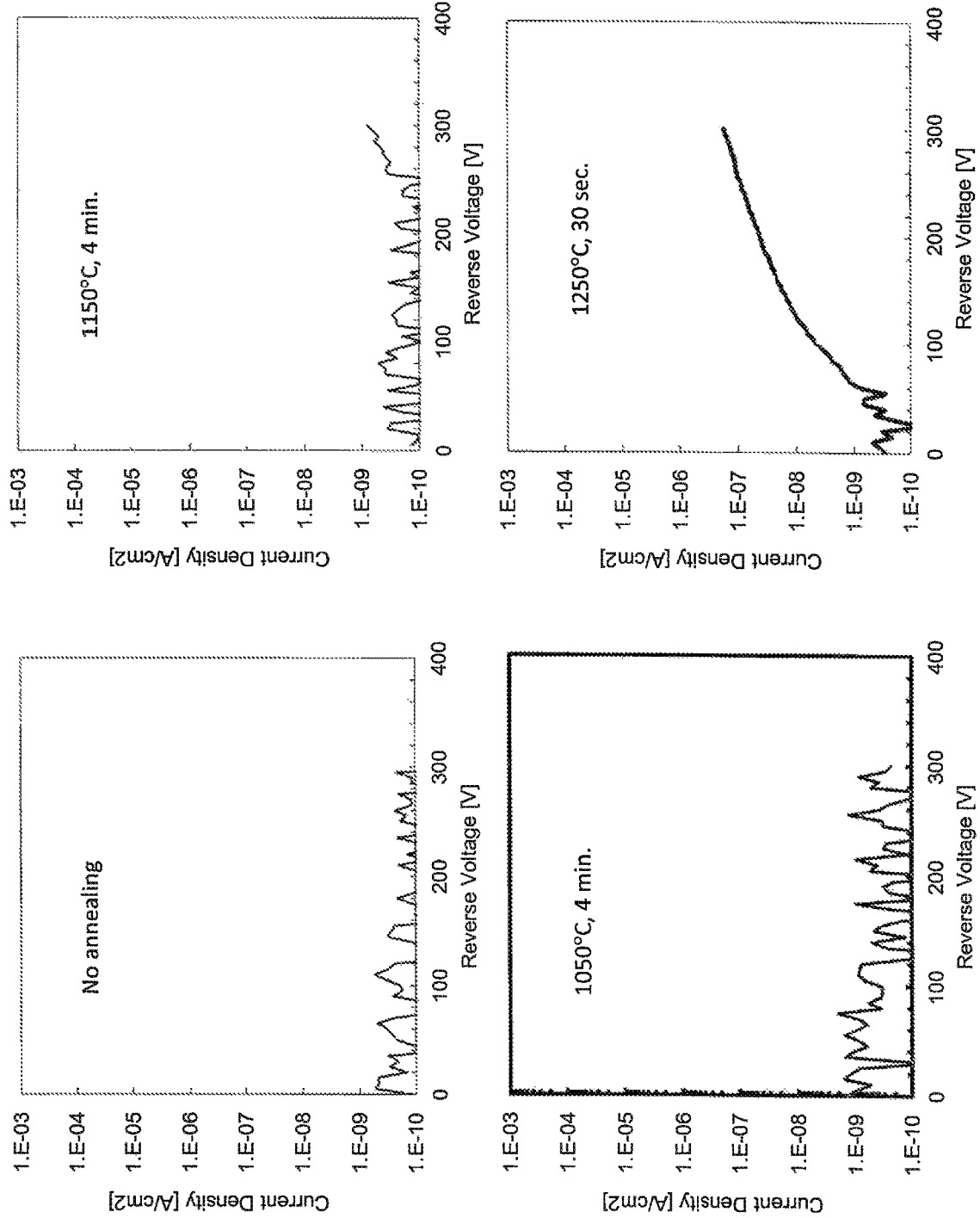
FIG. 16 shows graphs showing I-V characteristics of the element for evaluating region A of the semiconductor device according to the second embodiment.
Figure 17:
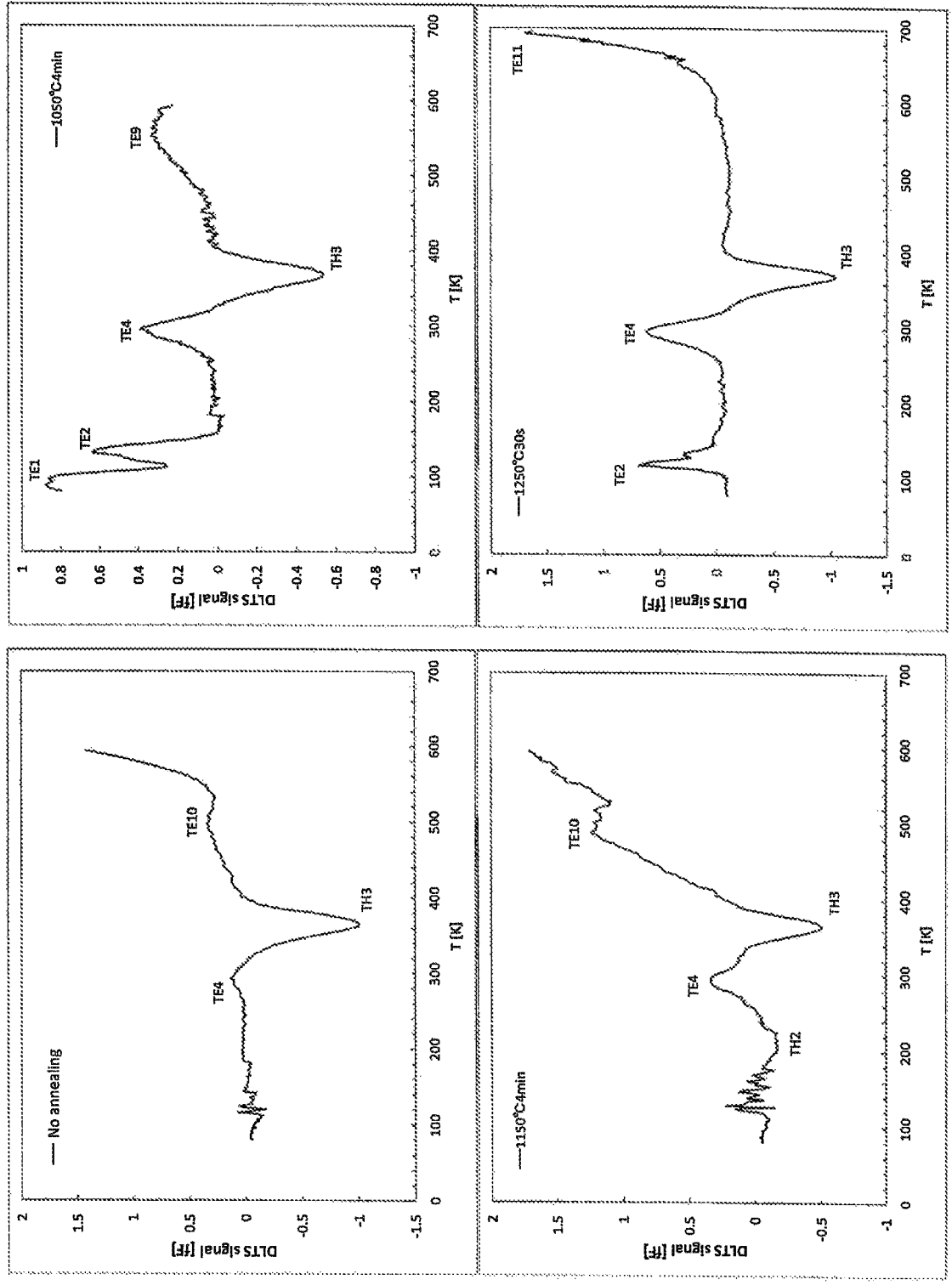
FIG. 17 shows graphs showing DLTS measurement results of the element for evaluating region A of the semiconductor device according to the second embodiment.

I-V measurements were performed by applying a reverse voltage in a range of 0 V to 300 V at a temperature of 25° C. to the above-produced element for evaluating region A. FIG. 16 shows graphs showing the measurement results. DLTS measurements were performed at a temperature of 77 K to 600 K, a bias voltage of −10V, and a pulse voltage of 0 V. However, only when annealing was performed at a temperature of 1,250° C. for 30 seconds, the temperature was set to 77 K to 700 K. FIG. 17 shows graphs showing the measurement results.

As shown in FIG. 16, it was found that leakage current is generated by annealing at not lower than 1,250° C., and the higher the annealing temperature, the larger the leakage current. Annealing is preferably performed at not higher than 1,150° C. to reduce leakage current.

By DLTS measurement, carrier trap level (electron trap level) was specified in a region having a depth of 0.8 μm to 1.6 μm on the n-type layer 101 side from a boundary between the n-type layer 101 and the p-type layer 102, and carrier trap level (hole trap level) was specified in a region having a depth of 0.02 μm to 0.05 μm on the p-type layer 102 side from a boundary between the n-type layer 101 and the p-type layer 102. The electron trap levels TE10 and TE11 having higher energy than that of TE9 or the hole trap level TH2 having lower energy than that of TH3 were specified. FIG. 18 shows tables of characteristics for each carrier trap level type. The carrier trap level types varied by annealing, and the average densities of the carrier trap levels were increased. Therefore, the increase of the leakage current by annealing is caused by the carrier trap level type and the increase in the average densities of the carrier trap levels.

Leakage current is largely increased at the annealing temperature of 1,250° C. compared to the annealing temperature of 1,150° C. It means that the relation among the average densities of a plurality of carrier trap levels at 1,050° C. and 1,150° C. contribute more largely to the reduction of the leakage current than the relation at 1,250° C. As shown in FIG. 17, TE4 appears at any annealing temperature, that is, both in annealing at 1,150° C. and annealing at 1,250° C. On the other hand, other carrier trap levels appear or disappear depending on with or without annealing or the annealing temperature. Therefore, the relation capable of reducing leakage current is preferably specified by the average density of the carrier trap level TE4.

The electron trap level TE4 is generated regardless of with or without annealing, and the average density of the electron trap level TE4 is considered to depend on the donor concentration of the n-type layer 101. For such reason, in region A of the semiconductor device of the second embodiment, the relation of the average densities of the plurality of electron trap levels at the annealing temperature of 1,150° C. that can reduce leakage current was specified by setting the average density of the electron trap level TE4 to not larger than 1/500 of the donor concentration of the n-type layer 101.

(Evaluation of Region B of Semiconductor Devices of the First and Second Embodiments)

Figure 11:
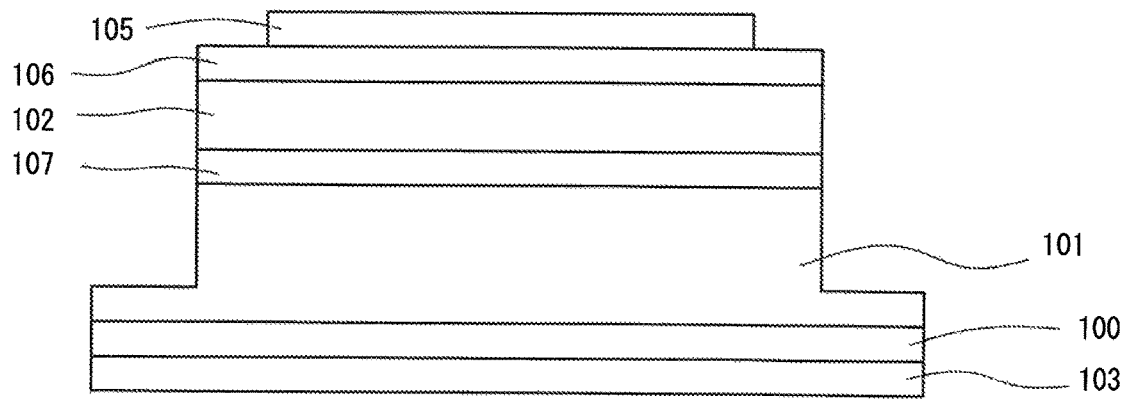
FIG. 11 shows the structure of an element for evaluating region B of the semiconductor devices according to the first and second embodiments.

An element for evaluating region B was produced as follows. Firstly, an n-type layer 101 having a thickness of 10 μm and a donor concentration of $5 \times 10^{15}/cm^3$, and a p-type layer 102 made of p-GaN having a thickness of 1 μm and a Mg concentration of $2 \times 10^{18}/cm^3$ were sequentially deposited through MOCVD on a substrate 100 made of n-GaN having a Si concentration of $1.0 \times 10^{18}/cm^3$ as shown in FIG. 11. Subsequently, an ion-implanted region 106 was formed by ion implantation of Mg to the entire surface of the p-type layer 102. Next, a SiN protective film was formed on the ion-implanted region 106, and annealing was performed. Elements were produced by annealing at 1,050° C. for 4 minutes, 1,050° C. for 20 minutes, and at 1,050° C. for 40 minutes. Mg was diffused into the n-type layer 101 by annealing, to thereby form a p-type diffusion region 107 in a region extending from the surface of the n-type layer 101 to a predetermined depth. Next, the protective film was removed by hydrofluoric acid, and the outer periphery of the element was dry-etched, to thereby form an element isolation region. Subsequently, an anode electrode 105 made of Pd was formed in Ohmic contact with the surface of the ion-implanted region 106, and a cathode electrode 103 made of Al/Ti was formed on the back surface of the substrate 100.

The element for evaluating region B has a structure different from region B of the semiconductor device of the first embodiment. However, it is similar in a point of detecting the carrier trap level in a depletion region of a pn boundary between the n-type layer and the p-type diffusion region. Therefore, the element for evaluating region B can evaluate region B of the semiconductor device of the first embodiment as well as region B of the semiconductor device of the second embodiment.

Figure 19:
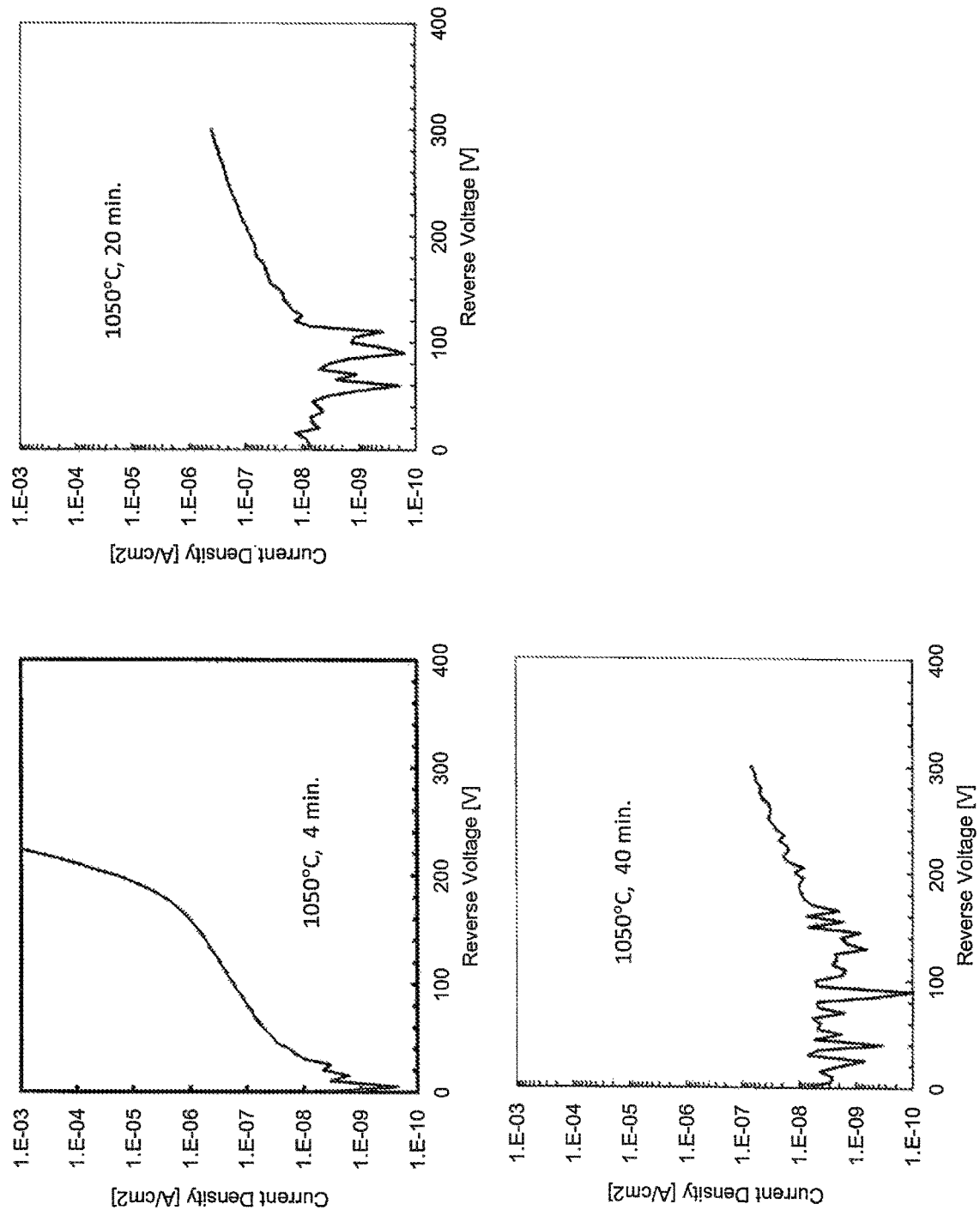
FIG. 19 shows graphs showing I-V characteristics of the element for evaluating region B.
Figure 20:
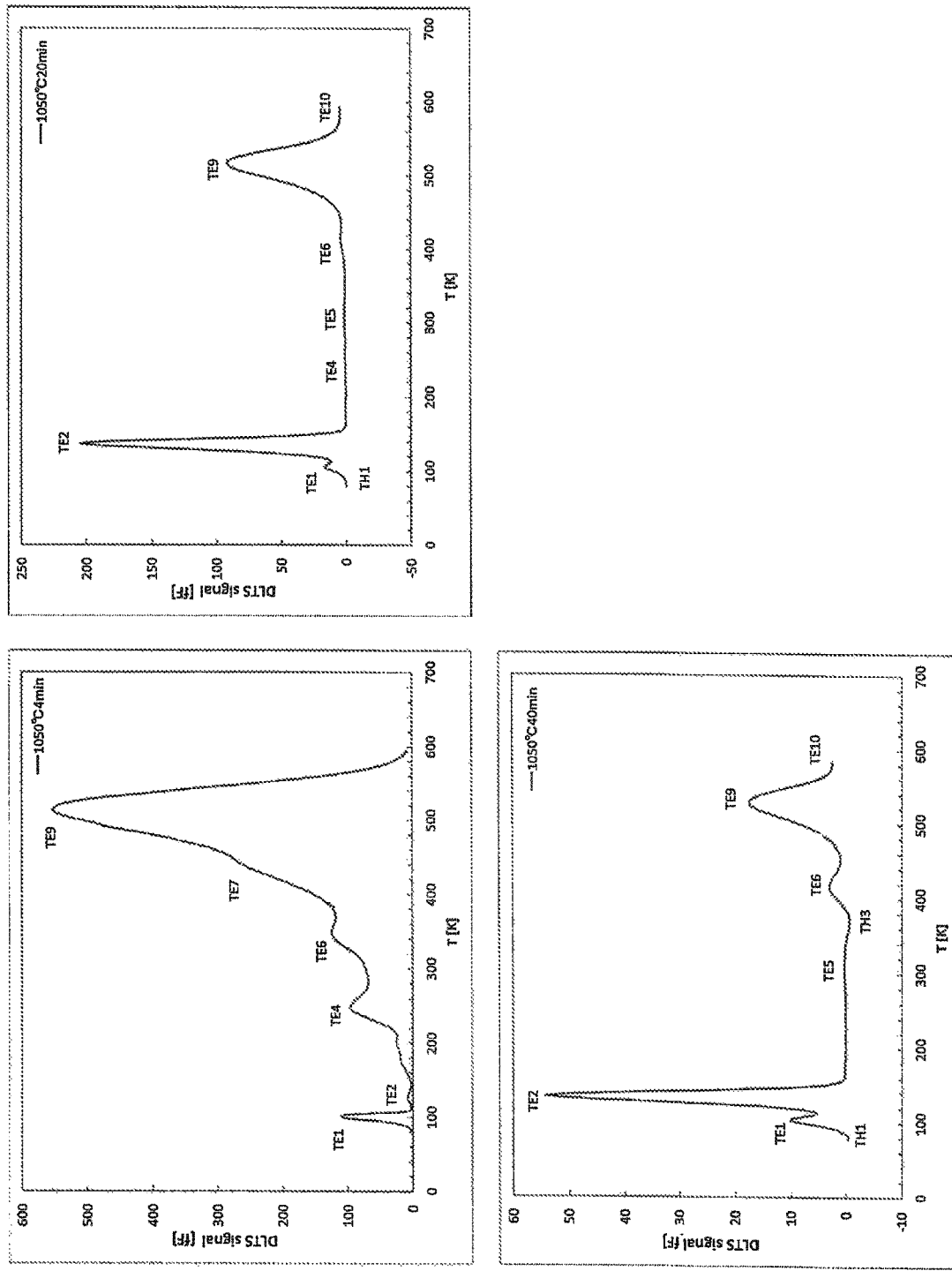
FIG. 20 shows graphs showing DLTS measurement results of the element for evaluating region B.

I-V measurements were performed by applying a reverse voltage in a range of 0 V to 300 V at a temperature of 25° C. to the element for evaluating the thus-produced region B. FIG. 19 shows graphs showing the measurement results. DLTS measurements were performed at a temperature of 77 K to 600 K, a bias voltage of −10V, and a pulse voltage of 0 V. FIG. 20 shows graphs showing the measurement results.

As shown in FIG. 19, it was found that the longer the annealing time is, the more the leakage current can be reduced, and that leakage current can be sufficiently reduced by annealing for not less than 20 minutes. This is considered that the longer the annealing time is, the more the ion implantation damage to the crystal is recovered.

By DLTS measurements, the carrier trap level (electron trap level) was specified in a region having a depth of 0.8 µm to 1.6 µm on the n-type layer 101 side from a boundary between the n-type layer 101 and the p-type diffusion region 107, the carrier trap level (hole trap level) was specified in a region having a depth of 0.02 µm to 0.05 µm on the p-type diffusion region 107 side from a boundary between the n-type layer 101 and the p-type diffusion region 107. The hole trap level having lower energy than that of TH2 was specified. FIG. 21 shows tables of characteristics for each carrier trap level type. It was found that the carrier trap level types varied depending on the annealing time, and that the longer the annealing time is, the more the average density of the carrier trap level is reduced. Thus, the reduction of leakage current by lengthening the annealing time is considered to be caused by the carrier trap level type and the reduction in the average densities of the carrier trap levels.

Leakage current is largely increased in annealing for 4 minutes compared to annealing for 20 minutes or 40 minutes. It means that the relation among the average densities of a plurality of carrier trap levels in annealing for 20 minutes or 40 minutes contribute more largely to the reduction of the leakage current than the relation in annealing for 4 minutes. In FIG. 20, peaks of TE1, TE2, and TE9 appear for any annealing time. It is considered that the smaller the trap level, the larger the contribution to leakage current, and that the average densities of the electron trap levels TE1 and TE2 make a great contribution to leakage current. Therefore, the relation capable of reducing leakage current is preferably specified by the average densities of the electron trap levels TE1, TE2, and TE9. The average densities of the electron trap levels generated without annealing is preferably used as criteria for evaluating the average densities of these electron trap levels.

Figure 22:
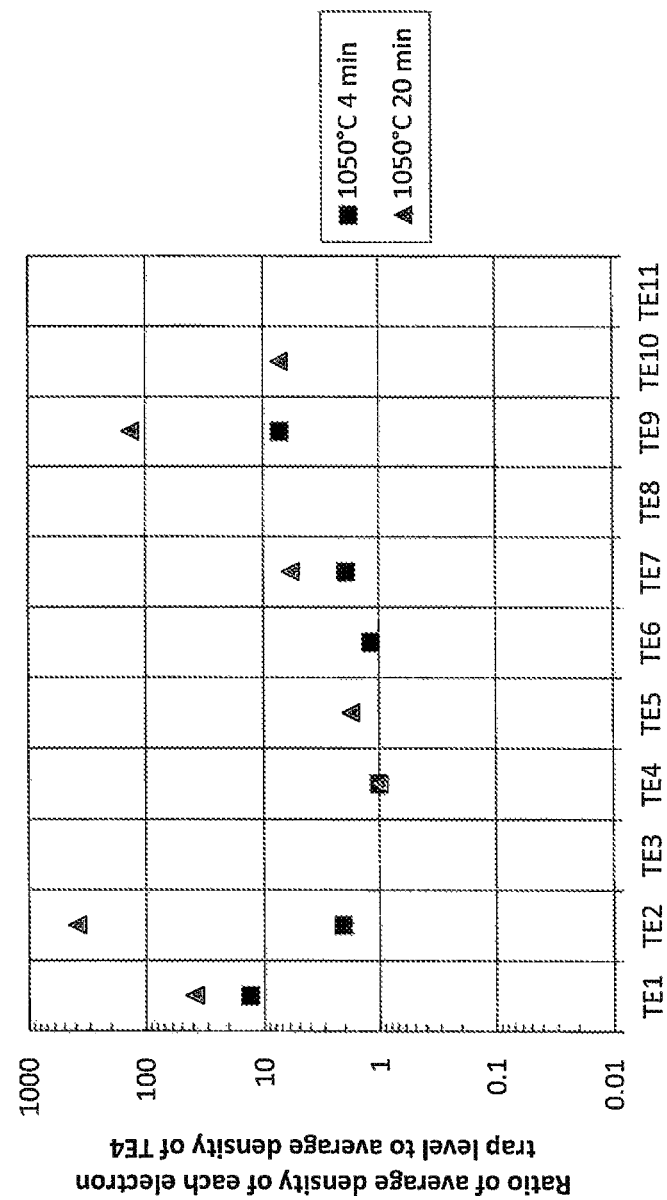
FIG. 22 is a graph showing the ratios of the average density of each carrier trap level to the average density of the carrier trap level TE4.

FIG. 22 is a graph showing the ratios of the average density of each electron trap level to the average density of the electron trap level TE4. As shown in FIG. 22, in annealing for 4 minutes, the ratio of the average density of the electron trap level TE1 is largest, followed by TE9 and TE2. On the other hand, in annealing for 20 minutes, the ratio of the average density of the electron trap level TE2 is largest, followed by TE9 and TE1.

For such reason, in region B of the semiconductor devices of the first and second embodiments, the ratio of the average density of the electron trap level TE2 to the average density of the electron trap level TE4 is set so as to be larger than the ratio of the average density of the electron trap level TE9 to the average density of the electron trap level TE4, and the ratio of the average density of the electron trap level TE9 to the average density of the electron trap level TE4 is set so as to be larger than the ratio of the average density of the electron trap level TE1 to the average density of the electron trap level TE4. Thereby, the relation of the average densities of the electron trap levels capable of reducing leakage current (the relation of the average densities of the carrier trap levels in annealing for 20 minutes) was specified.

Figure 23:
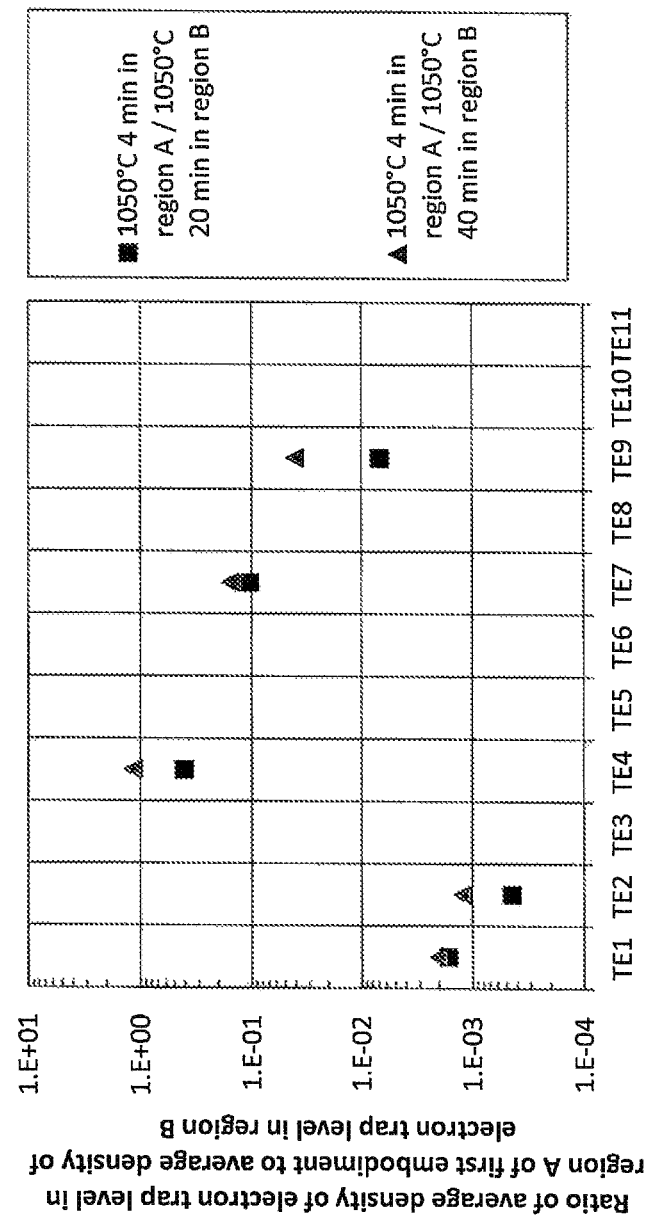
FIG. 23 is a graph showing the ratios of the average density of each carrier trap level in the element for evaluating region A of the semiconductor device according to the first embodiment to the average density of each carrier trap level in the element for evaluating region B.

FIG. 23 is a graph showing the ratios of the average density of each carrier trap level in the element for evaluating region A of the semiconductor device of the first embodiment (diode) to the average density of each carrier trap level in the element for evaluating region B. FIG. 23 suggests that leakage current can be reduced by specifying the average density ratios as follows. The ratio of the average density of the electron trap level TE1 is not larger than 0.01. The ratio of the average density of the electron trap level TE2 is not larger than 0.01. The ratio of the average density of the electron trap level TE4 is 0.4 to 2.5. The ratio of the average density of the electron trap level TE7 is not larger than 0.2. The ratio of the average density of the electron trap level TE9 is not larger than 0.04.

Figure 24:
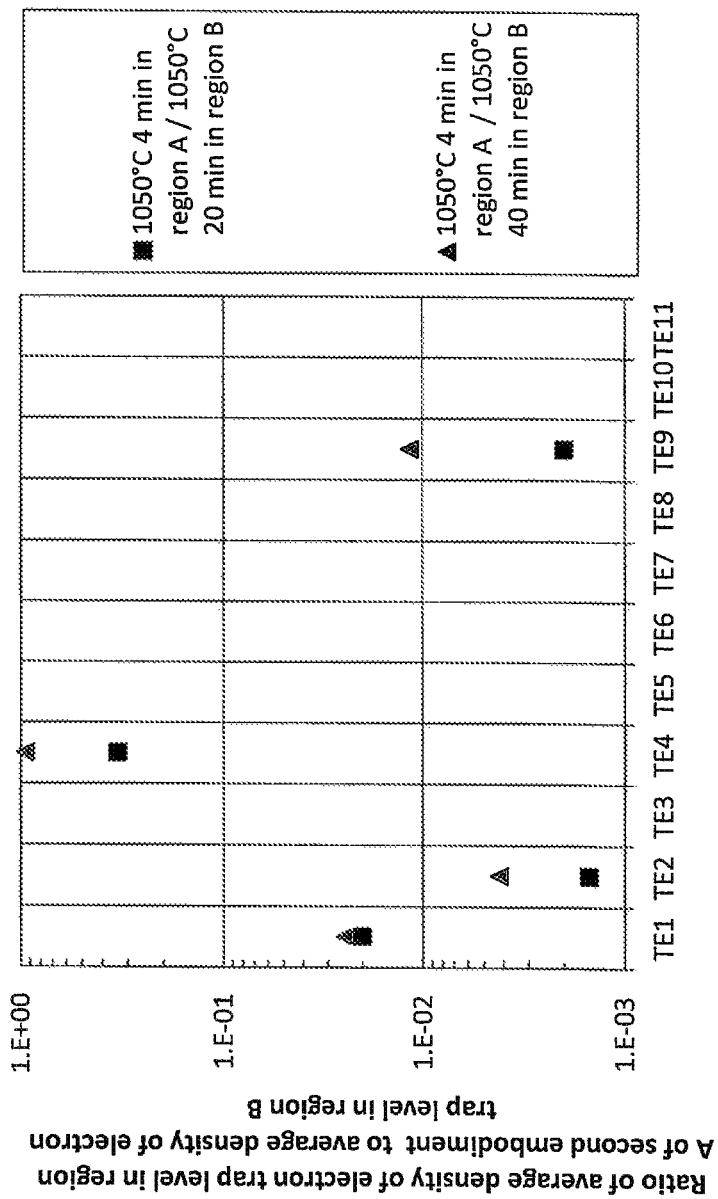
FIG. 24 is a graph showing the ratios of the average density of each carrier trap level of the element for evaluating region A of the semiconductor device according to the second embodiment to the average density of each carrier trap level in the element for evaluating region B.

FIG. 24 is a graph showing the ratios of the average density of each electron trap level in the element for evaluating region A of the semiconductor device of the second embodiment (FET) to the average density of each electron trap level in the element for evaluating region B. FIG. 24 suggests that leakage current can be reduced by specifying the average density ratios as follows. The ratio of the average density of the electron trap level TE1 is 0.01 to 0.03. The ratio of the average density of the electron trap level TE2 is 0.0001 to 0.005. The ratio of the average density of the electron trap level TE4 is 0.3 to 2.0. The ratio of the average density of the electron trap level TE9 is 0.002 to 0.02. The similar comparison suggests that leakage current can be reduced when the ratio of the average density of the hole trap level TH3 is 0.7 to 1.4.

It was found from the above experiment results that annealing for forming a p-type diffusion region by diffusing Mg is preferably performed at a temperature of 1,000° C. to 1,100° C. for 5 minutes to 40 minutes.

(Other Variations)

The semiconductor device of the first embodiment is a Schottky barrier diode. The present invention may be applied to a semiconductor device having any structure as long as a p-type diffusion region 12 is formed in a part of the n-type layer 11 and a Schottky electrode is formed on the n-type layer 11. The semiconductor device of the second embodiment is a trench-type MISFET. The present invention may be applied to a semiconductor device having any structure as long as an n-type layer 21 and a p-type layer 22 are sequentially deposited, and a p-type diffusion region 23 is formed in a part of the n-type layer 21. For example, the present invention may be applied to a pn diode, a pin diode, IGBT, and HFET. In the first and second embodiments, the semiconductor device has a vertical type structure which establishes electrical continuity in a vertical direction (direction perpendicular to the main surface of a substrate). The present invention may be applied to a semiconductor device having a horizontal type structure which establishes electrical continuity in a direction horizontal to the main surface of a substrate.

The semiconductor device of the present invention can be used in the power device.

What is claimed is:

1. A semiconductor device having an n-type GaN layer with a donor concentration of $1 \times 10^{15}/cm^3$ to $2 \times 10^{16}/cm^3$, a p-type GaN region formed by ion implantation and annealing in a part of the n-type layer, and a Schottky electrode formed on the n-type layer and the p-type region and coming into Schottky contact with the n-type layer,
   wherein a region without the p-type region in plan view is defined as region A;
   an electron trap energy level of 0.10 eV to 0.20 eV below the GaN conduction band edge is defined as TE1;
   an electron trap energy level of 0.30 eV to 0.45 eV below the GaN conduction band edge is defined as TE3;
   an electron trap energy level of 0.45 eV to 0.60 eV below the GaN conduction band edge is defined as TE4;
   an average density of each electron trap level in the region A is an average density of each electron trap level of the n-type layer in a region having a depth of 0.8 µm to 1.6 µm on the n-type layer side from a boundary between the n-type layer and the Schottky electrode; and
   the average density of each electron trap level in the region A is set so that the ratio of the average density of the electron trap level TE1 to the average density of the electron trap level TE4 is larger than the ratio of the average density of the electron trap level TE3 to the average density of the electron trap level TE4, and the ratio of the average density of the electron trap level TE1 to the average density of the electron trap level TE4 is not larger than 1.

2. The semiconductor device according to claim 1, wherein a region with the p-type region in plan view is defined as region B;
   an average density of each electron trap level in the region B is an average density of each electron trap level of the n-type layer in a region having a depth of 0.8 µm to 1.6 µm on the n-type layer side from a boundary between the n-type layer and the p-type region; and
   the ratio of the average density of the electron trap level TE1 in the region A to the average density of the electron trap level TE1 in the region B is set to not larger than 0.01.

3. The semiconductor device according to claim 1, wherein an electron trap energy level of 0.20 eV to 0.30 eV below the GaN conduction band edge is defined as TE2;
   a region with the p-type region in plan view is defined as region B;
   an average density of each electron trap level in the region B is an average density of each electron trap level of the n-type layer in a region having a depth of 0.8 µm to 1.6 µm on the n-type layer side from a boundary between the n-type layer and the p-type region; and
   the ratio of the average density of the electron trap level TE2 in the region A to the average density of the electron trap level TE2 in the region B is set to not larger than 0.01.

4. The semiconductor device according to claim 1, wherein a region with the p-type region in plan view is defined as region B;
   an average density of each electron trap level in the region B is an average density of each electron trap level of the n-type layer in a region having a depth of 0.8 µm to 1.6 µm on the n-type layer side from a boundary between the n-type layer and the p-type region; and
   the ratio of the average density of the electron trap level TE4 in the region A to the average density of the electron trap level TE4 in the region B is set to 0.4 to 2.5.

5. The semiconductor device according to claim 1, wherein an electron trap energy level of 0.90 eV to 1.00 eV below the GaN conduction band edge is defined as TE7;
   a region with the p-type region in plan view is defined as region B;
   an average density of each electron trap level in the region B is an average density of each electron trap level of the n-type layer in a region having a depth of 0.8 µm to 1.6 µm on the n-type layer side from a boundary between the n-type layer and the p-type region; and
   the ratio of the average density of the electron trap level TE7 in the region A to the average density of the electron trap level TE7 in the region B is set to not larger than 0.2.

6. The semiconductor device according to claim 1, wherein an electron trap energy level of 1.10 eV to 1.40 eV below the GaN conduction band edge is defined as TE9;
   a region with the p-type region in plan view is defined as region B;
   an average density of each electron trap level in the region B is an average density of each electron trap level of the n-type layer in a region having a depth of 0.8 µm to 1.6 µm on the n-type layer side from a boundary between the n-type layer and the p-type region; and
   the ratio of the average density of the electron trap level TE9 in the region A to the average density of the electron trap level TE9 in the region B is preferably set to not larger than 0.04.

7. A semiconductor device having an n-type GaN layer with a donor concentration of $1 \times 10^{15}/cm^3$ to $2 \times 10^{16}/cm^3$, a p-type GaN region formed by ion implantation and annealing in a part of the n-type layer, and a Schottky electrode formed on the n-type layer and the p-type region and coming into Schottky contact with the n-type layer,
   wherein a region with the p-type region in plan view is defined as region B;
   an electron trap energy level of 0.10 eV to 0.20 eV below the GaN conduction band edge is defined as TE1;
   an electron trap energy level of 0.20 eV to 0.30 eV below the GaN conduction band edge is defined as TE2;
   an electron trap energy level of 0.45 eV to 0.60 eV below the GaN conduction band edge is defined as TE4;
   an electron trap energy level of 1.10 eV to 1.40 eV below the GaN conduction band edge is defined as TE9;
   an average density of each electron trap level in the region B is an average density of each electron trap level of the n-type layer in a region having a depth of 0.8 µm to 1.6 µm on the n-type layer side from a boundary between the n-type layer and the p-type region; and
   the average density of each electron trap level in the region B is set so that the ratio of the average density of the electron trap level TE2 to the average density of the electron trap level TE4 is larger than the ratio of the average density of the electron trap level TE9 to the average density of the electron trap level TE4, and the ratio of the average density of the electron trap level TE9 to the average density of the electron trap level TE4 is larger than the ratio of the average density of the electron trap level TE1 to the average density of the electron trap level TE4.

8. The semiconductor device according to claim 7, wherein a region without the p-type region in plan view is defined as region A;
an average density of each electron trap level in the region A is an average density of each electron trap level of the n-type layer in a region having a depth of 0.8 µm to 1.6 µm on the n-type layer side from a boundary between the n-type layer and the Schottky electrode; and
the ratio of the average density of the electron trap level TE1 in the region A to the average density of the electron trap level TE1 in the region B is set to not larger than 0.01.

9. The semiconductor device according to claim 7, wherein a region without the p-type region in plan view is defined as region A;
an average density of each electron trap level in the region A is an average density of each electron trap level of the n-type layer in a region having a depth of 0.8 µm to 1.6 µm on the n-type layer side from a boundary between the n-type layer and the Schottky electrode; and
the ratio of the average density of the electron trap level TE2 in the region A to the average density of the electron trap level TE2 in the region B is set to not larger than 0.01.

10. The semiconductor device according to claim 7, wherein a region without the p-type region in plan view is defined as region A;
an average density of each electron trap level in the region A is an average density of each electron trap level of the n-type layer in a region having a depth of 0.8 µm to 1.6 µm on the n-type layer side from a boundary between the n-type layer and the Schottky electrode; and
the ratio of the average density of the electron trap level TE4 in the region A to the average density of the electron trap level TE4 in the region B is set to 0.4 to 2.5.

11. The semiconductor device according to claim 7, wherein an electron trap energy level of 0.90 eV to 1.00 eV below the GaN conduction band edge is defined as TE7,
a region without the p-type region in plan view is defined as region A;
an average density of each electron trap level in the region A is an average density of each electron trap level of the n-type layer in a region having a depth of 0.8 µm to 1.6 µm on the n-type layer side from a boundary between the n-type layer and the Schottky electrode; and
the ratio of the average density of the electron trap level TE7 in the region A to the average density of the electron trap level TE7 in the region B is set to not larger than 0.2.

12. The semiconductor device according to claim 7, wherein a region without the p-type region in plan view is defined as region A;
an average density of each electron trap level in the region A is an average density of each electron trap level of the n-type layer in a region having a depth of 0.8 µm to 1.6 µm on the n-type layer side from a boundary between the n-type layer and the Schottky electrode; and
the ratio of the average density of the electron trap level TE9 in the region A to the average density of the electron trap level TE9 in the region B is set to not larger than 0.04.

13. A semiconductor device having an n-type GaN layer with a donor concentration of $1\times10^{15}/cm^3$ to $2\times10^{16}/cm^3$, a p-type GaN layer formed on the n-type layer, and a p-type GaN region formed by ion implantation and annealing in a part of the n-type layer,
wherein a region without the p-type region in plan view is defined as region A;
an electron trap energy level of 0.45 eV to 0.60 eV below the GaN conduction band edge is defined as TE4;
an average density of each electron trap level in the region A is an average density of each electron trap level of the n-type layer in a region having a depth of 0.8 µm to 1.6 µm on the n-type layer side from a boundary between the n-type layer and the p-type layer; and
the average density of each electron trap level in the region A is set to not larger than 1/500 of the donor concentration of the n-type layer.

14. The semiconductor device according to claim 13, wherein an electron trap energy level of 0.10 eV to 0.20 eV below the GaN conduction band edge is defined as TE1;
a region with the p-type region in plan view is defined as region B;
an average density of each electron trap level in the region B is an average density of each electron trap level of the n-type layer in a region having a depth of 0.8 µm to 1.6 µm on the n-type layer side from a boundary between the n-type layer and the p-type region; and
the ratio of the average density of the electron trap level TE1 in the region A to the average density of the electron trap level TE1 in the region B is set to not larger than 0.03.

15. The semiconductor device according to claim 13, wherein an electron trap energy level of 0.20 eV to 0.30 eV below the GaN conduction band edge is defined as TE2;
a region with the p-type region in plan view is defined as region B;
an average density of each electron trap level in the region B is an average density of each electron trap level of the n-type layer in a region having a depth of 0.8 µm to 1.6 µm on the n-type layer side from a boundary between the n-type layer and the p-type region; and
the ratio of the average density of the electron trap level TE2 in the region A to the average density of the electron trap level TE2 in the region B is set to not larger than 0.02.

16. The semiconductor device according to claim 13, wherein a region with the p-type region in plan view is defined as region B;
an average density of each electron trap level in the region B is an average density of each electron trap level of the n-type layer in a region having a depth of 0.8 µm to 1.6 µm on the n-type layer side from a boundary between the n-type layer and the p-type region; and
the ratio of the average density of the electron trap level TE4 in the region A to the average density of the electron trap level TE4 in the region B is set to 0.3 to 2.0.

17. The semiconductor device according to claim 13, wherein an electron trap energy level of 1.10 eV to 1.40 eV below the GaN conduction band edge is defined as TE9;
a region with the p-type region in plan view is defined as region B;
an average density of each electron trap level in the region B is an average density of each electron trap level of the n-type layer in a region having a depth of 0.8 µm to 1.6 µm on the n-type layer side from a boundary between the n-type layer and the p-type region; and
the ratio of the average density of the electron trap level TE9 in the region A to the average density of the electron trap level TE9 in the region B is preferably set to not larger than 0.02.

18. The semiconductor device according to claim 13, wherein a hole trap energy level of 0.80 eV to 0.90 eV above the GaN valence band edge is defined as TH3;
    a region with the p-type region in plan view is defined as region B;
    an average density of the hole trap level in the region A is an average density of the hole trap level of the p-type layer in a region having a depth of 0.02 μm to 0.05 μm on the p-type layer side from a boundary between the n-type layer and the p-type layer;
    the average density of the hole trap level in the region B is an average density of the hole trap level of the p-type region in a region having a depth of 0.02 μm to 0.05 μm on the p-type region side from a boundary between the n-type layer and the p-type region; and
    the ratio of the average density of the hole trap level TH3 of the p-type layer in the region A to the average density of the hole trap level TH3 of the p-type region in the region B is preferably set to 0.7 to 1.4.

19. A semiconductor device having an n-type GaN layer with a donor concentration of $1\times10^{15}/cm^3$ to $2\times10^{16}/cm^3$, a p-type GaN layer formed on the n-type layer, and a p-type GaN region formed by ion implantation and annealing in a part of the n-type layer,
    wherein a region with the p-type region in plan view is defined as region B;
    an electron trap energy level of 0.10 eV to 0.20 eV below the GaN conduction band edge is defined as TE1;
    an electron trap energy level of 0.20 eV to 0.30 eV below the GaN conduction band edge is defined as TE2;
    an electron trap energy level of 0.45 eV to 0.60 eV below the GaN conduction band edge is defined as TE4;
    an electron trap energy level of 1.10 eV to 1.40 eV below the GaN conduction band edge is defined as TE9;
    an average density of each electron trap level in the region B is an average density of each electron trap level of the n-type layer in a region having a depth of 0.8 μm to 1.6 μm on the n-type layer side from a boundary between the n-type layer and the p-type region; and
    the average density of each electron trap level in the region B is set so that the ratio of the average density of the electron trap level TE2 to the average density of the electron trap level TE4 is larger than the ratio of the average density of the electron trap level TE9 to the average density of the electron trap level TE4, and the ratio of the average density of the electron trap level TE9 to the average density of the electron trap level TE4 is larger than the ratio of the average density of the electron trap level TE1 to the average density of the electron trap level TE4.

20. The semiconductor device according to claim 19, wherein a region without the p-type region in plan view is defined as region A;
    an average density of each electron trap level in the region A is an average density of each electron trap level of the n-type layer in a region having a depth of 0.8 μm to 1.6 μm on the n-type layer side from a boundary between the n-type layer and the p-type layer; and
    the ratio of the average density of the electron trap level TE1 in the region A to the average density of the electron trap level TE1 in the region B is set to not larger than 0.03.

21. The semiconductor device according to claim 19, wherein a region without the p-type region in plan view is defined as region A;
    an average density of each electron trap level in the region A is an average density of each electron trap level of the n-type layer in a region having a depth of 0.8 μm to 1.6 μm on the n-type layer side from a boundary between the n-type layer and the p-type layer; and
    the ratio of the average density of the electron trap level TE2 in the region A to the average density of the electron trap level TE2 in the region B is set to not larger than 0.02.

22. The semiconductor device according to claim 19, wherein a region without the p-type region in plan view is defined as region A;
    an average density of each electron trap level in the region A is an average density of each electron trap level of the n-type layer in a region having a depth of 0.8 μm to 1.6 μm on the n-type layer side from a boundary between the n-type layer and the p-type layer; and
    the ratio of the average density of the electron trap level TE4 in the region A to the average density of the electron trap level TE4 in the region B is set to 0.3 to 2.0.

23. The semiconductor device according to claim 19, wherein a region without the p-type region in plan view is defined as region A;
    an average density of each electron trap level in the region A is an average density of each electron trap level of the n-type layer in a region having a depth of 0.8 μm to 1.6 μm on the n-type layer side from a boundary between the n-type layer and the p-type layer; and
    the ratio of the average density of the electron trap level TE9 in the region A to the average density of the electron trap level TE9 in the region B is preferably set to not larger than 0.02.

24. The semiconductor device according to claim 19, wherein a hole trap energy level of 0.80 eV to 0.90 eV above the GaN valence band edge is defined as TH3;
    a region without the p-type region in plan view is defined as region A;
    an average density of the hole trap level in the region A is an average density of the hole trap level of the p-type layer in a region having a depth of 0.02 μm to 0.05 μm on the p-type layer side from a boundary between the n-type layer and the p-type layer,
    the average density of the hole trap level in the region B is an average density of the hole trap level of the p-type region in a region having a depth of 0.02 μm to 0.05 μm on the p-type region side from a boundary between the n-type layer and the p-type region; and
    the ratio of the average density of the hole trap level TH3 of the p-type layer in the region A to the average density of the hole trap level TH3 of the p-type region in the region B is preferably set to 0.7 to 1.4.

* * * * *